(12) United States Patent
Kim

(10) Patent No.: US 11,374,087 B2
(45) Date of Patent: Jun. 28, 2022

(54) SEMICONDUCTOR DEVICE AND METHOD FOR FABRICATING THE SAME

(71) Applicant: SK hynix Inc., Gyeonggi-do (KR)

(72) Inventor: Seung-Muk Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 127 days.

(21) Appl. No.: 16/534,657

(22) Filed: Aug. 7, 2019

(65) Prior Publication Data
US 2020/0212169 A1 Jul. 2, 2020

(30) Foreign Application Priority Data

Dec. 27, 2018 (KR) .................. 10-2018-0170952

(51) Int. Cl.
*H01L 49/02* (2006.01)
(52) U.S. Cl.
CPC .............. *H01L 28/75* (2013.01); *H01L 28/91* (2013.01)

(58) Field of Classification Search
CPC combination set(s) only.
See application file for complete search history.

(56) References Cited

U.S. PATENT DOCUMENTS

| | | | |
|---|---|---|---|
| 7,713,831 B2 | 5/2010 | Park et al. | |
| 9,093,460 B2 | 7/2015 | Kim et al. | |
| 9,673,272 B2 | 6/2017 | Choi et al. | |
| 2013/0256828 A1* | 10/2013 | Lee | H01L 27/10882 257/506 |
| 2014/0103491 A1* | 4/2014 | Kim | H01L 28/60 257/532 |
| 2019/0051724 A1* | 2/2019 | Do | H01L 29/0669 |

* cited by examiner

*Primary Examiner* — Ratisha Mehta
(74) *Attorney, Agent, or Firm* — IP & T Group LLP

(57) ABSTRACT

A method for fabricating a semiconductor device includes forming an upper structure in which a bottom electrode, a dielectric layer, a top electrode and a plasma protection layer are sequentially stacked on a lower structure, exposing the upper structure to a plasma treatment, and exposing the plasma-treated upper structure and the lower structure to a hydrogen passivation process.

19 Claims, 19 Drawing Sheets dance with an embodiment of the present invention disclosure.

SEMICONDUCTOR DEVICE AND METHOD FOR FABRICATING THE SAME

CROSS-REFERENCE TO RELATED APPLICATION

The present application claims priority to Korean Patent Application No. 10-2018-0170952, filed on Dec. 27, 2018, which is incorporated herein by reference in its entirety.

BACKGROUND

1. Field

Various embodiments relate generally to a semiconductor device and, more particularly, to a semiconductor device including a capacitor and a method for fabricating the same.

2. Description of the Related Art

Deposition and etch processes using plasma are applied in a semiconductor device fabricating process. However, the reliability of a semiconductor device may deteriorate due to a plasma induced damage which may occur during a plasma treatment.

SUMMARY

Various embodiments of the present invention are directed to a semiconductor device having improved reliability, and a method for fabricating the same.

In accordance with an embodiment, a method for fabricating a semiconductor device may include: forming an upper structure in which a bottom electrode, a dielectric layer, a top electrode and a plasma protection layer are sequentially stacked on a lower structure, exposing the upper structure to a plasma treatment, and exposing the plasma-treated upper structure and the lower structure to a hydrogen passivation process.

In accordance with an embodiment, a method for fabricating a semiconductor device may include: forming a capacitor in which a bottom electrode, a dielectric layer and a top electrode are sequentially stacked on a lower structure; forming a plasma protection layer including a plurality of non-conductive segments on the top electrode; forming an interlayer dielectric layer on the plasma protection layer; forming a contact hole landing on each of the segments by performing a plasma etch process on the interlayer dielectric layer; partially etching the segments to expose the top electrode below the contact hole; forming a metal wiring connected to the top electrode through the contact hole; and exposing the capacitor having the metal wiring formed therein and the lower structure to a hydrogen passivation process.

In accordance with an embodiment, a semiconductor device includes: a lower structure; an upper structure in which a bottom electrode, a dielectric layer, a top electrode and a plasma protection layer are sequentially stacked on the lower structure; an interlayer dielectric layer on the plasma protection layer; and a metal wiring connected to the top electrode through the interlayer dielectric layer and the plasma protection layer, wherein the plasma protection layer includes a non-conductive material. The plasma protection layer fully covers the top electrode. The plasma protection layer partially covers the top electrode. The plasma protection layer includes a plurality of segments disposed on the top electrode, and the metal wiring penetrates one or more of the segments. The plasma protection layer includes a material having a high hydrogen diffusivity. The plasma protection layer includes undoped polysilicon. The plasma protection layer includes engineered stressed silicon nitride.

These and other features and advantages of the present invention will become apparent to those skilled in the art of the invention from the following detailed description in conjunction with the following drawings.

DETAILED DESCRIPTION

Figure 1:
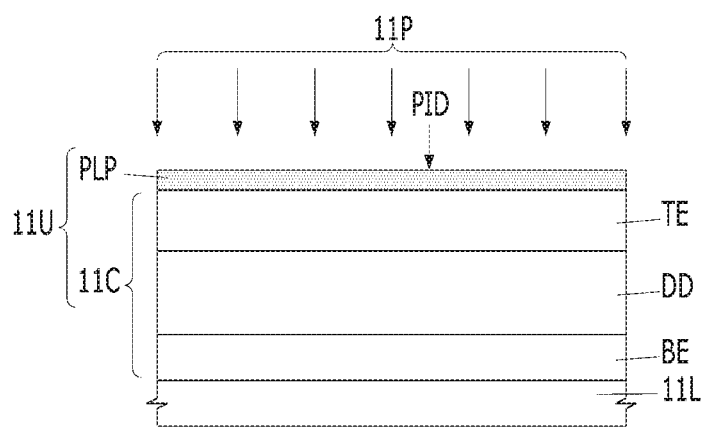
FIG. 1 is a cross-sectional view illustrating a method for fabricating a semiconductor device in accordance with an embodiment of the present invention disclosure.

Various embodiments of the present invention will be described herein with reference to cross-sectional views, plan views and block diagrams, which are ideal schematic views of the present invention. Thus, the shape of the illustrations may be modified by fabricating techniques and/or tolerances. Accordingly, the embodiments of the present invention are not limited to the specific forms shown, but also include changes in the shapes that are generated according to the fabricating process. The regions illustrated in the figures have schematic attributes, and the shapes of the regions illustrated in the figures are intended to illustrate specific types of regions of the elements and are not intended to limit the scope of the invention.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. Furthermore, the connection/coupling may not be limited to a physical connection but may also include a non-physical connection, e.g., a wireless connection.

In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure.

It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

It should be understood that the drawings are simplified schematic illustrations of the described devices and may not include well known details for avoiding obscuring the disclosure of the features of the invention.

It should also be noted that features present in one embodiment may be used with one or more features of another embodiment without departing from the scope of the invention. FIG. 1 is a cross-sectional view illustrating a method for fabricating a semiconductor device in accordance with an embodiment of the present invention disclosure.

Referring to FIG. 1, the method for fabricating the semiconductor device may include forming a lower structure 11L, forming an upper structure 11U, and performing a plasma treatment 11P. According to an embodiment, the upper structure 11U may include a capacitor 11C and a plasma protection layer PLP. The plasma protection layer PLP may protect the capacitor 11C of the upper structure 11U from plasma induced damage PID which occurs during the plasma treatment 11P. For example, the plasma protection layer PLP may block plasma charges concentrated during the plasma treatment 11P.

Since the capacitor 11C of the upper structure 11U is protected by the plasma protection layer PLP as described above, the reliability of the semiconductor device may be improved. The capacitor 11C may have a structure in which a bottom electrode BE, a dielectric layer DD and a top electrode TE are sequentially stacked. The top electrode TE and the dielectric layer DD may be protected from the plasma induced damage PID by the plasma protection layer PLP.

FIGS. 2A to 2E are cross-sectional views illustrating a method for fabricating a semiconductor device in accordance with an embodiment of the present invention disclosure.

Figure 2A:
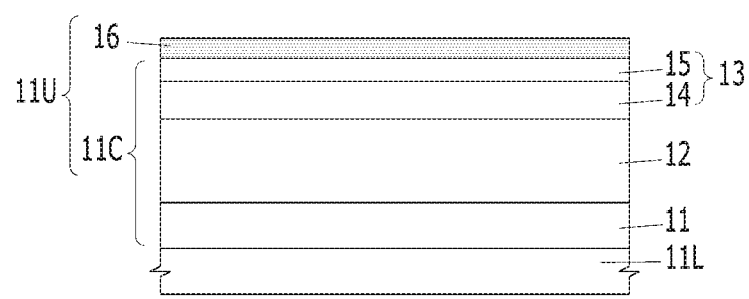
FIGS. 2A to 2E are cross-sectional views illustrating a method for fabricating a semiconductor device in accordance with an embodiment of the present invention disclosure.

Referring to FIG. 2A, an upper structure 11U may be formed on a lower structure 11L. The lower structure 11L may include, for example, a semiconductor substrate, a transistor, a dielectric layer, a bit line. The lower structure 11L is not limited to the above examples, and may include any part, layer, or component of a semiconductor device.

The upper structure 11U may include a capacitor 11C and a plasma protection layer 16. For example, the capacitor 11C may have a structure in which a bottom electrode 11, a dielectric layer 12 and a top electrode 13 are sequentially stacked, however, the invention is not limited in this type of a capacitor only. The top electrode 13 may be single-layered or multi-layered. In the illustrated embodiment, the top electrode 13 may include a first layer 14 and a second layer 15. For example, the first layer 14 may include silicon germanium and the second layer 15 may include tungsten nitride.

The plasma protection layer 16 may be formed on the top electrode 13. The plasma protection layer 16 and the top electrode 13 may be formed by the same photolithography process. In some embodiments, the plasma protection layer 16 may be formed by depositing and etching a capping material after the top electrode 13 is formed. The plasma protection layer 16 may cover at least the top electrode 13. In some embodiments, the plasma protection layer 16 may cover the top and sidewalls of the capacitor.

The plasma protection layer 16 may include a non-conductive material. The plasma protection layer 16 may be a material having a high etch selectivity to the top electrode 13. The plasma protection layer 16 may include a material having high hydrogen passivation efficiency. The plasma protection layer 16 may include an engineered stress material.

As described above, the plasma protection layer 16 may include a material having non-conductivity, high hydrogen passivation efficiency, a high etch selectivity and engineered stress. The plasma protection layer 16 may be a material capable of preventing a loss of the top electrode 13 during a subsequent contact-etch process. The plasma protection layer 16 may be any suitable material that facilitates hydrogen diffusion during a subsequent hydrogen passivation process.

Materials suitable for the plasma protection layer 16 may, for example, include a polysilicon-based material or a silicon nitride-based material. The plasma protection layer 16 may include undoped polysilicon, silicon nitride (SiN), silicon oxynitride (SiON), silicon carbon nitride (SiCN), silicon boron nitride (SiBN) or combinations thereof. The updoped polysilicon is a dielectric material since it does not include a dopant. The updoped polysilicon may have a high etch selectivity when silicon oxide is etched. The updoped polysilicon may not block hydrogen diffusion.

As a comparative example, the plasma protection layer 16 may include silicon oxide, doped silicon, titanium nitride, tungsten, aluminum or copper.

Since silicon oxide has a low etch selectivity, it is difficult to prevent the top electrode 13 from being damaged. Since doped silicon, titanium nitride, tungsten, aluminum and copper are conductive materials, the dielectric layer 12 may be damaged due to a strong electric field attributable to the concentration of plasma charges. Doped silicon, titanium nitride, tungsten, aluminum and copper are materials that block hydrogen diffusion, which may reduce hydrogen passivation efficiency.

Silicon nitride (SiN), silicon oxynitride (SiON), silicon carbon nitride (SiCN) and silicon boron nitride (SiBN) may have engineered stress. The engineered stress may include stress capable of preventing the lower structure 11L from cracking. For example, the engineered stress may include any one of compressive stress, tensile stress and zero stress.

The non-conductivity characteristic of the plasma protection layer 16 according to the present embodiment may suppress the concentration of the plasma charges. The high etch selectivity characteristic of the plasma protection layer 16 may prevent the etch damage of the top electrode 13. The high hydrogen passivation efficiency characteristic of the plasma protection layer 16 may improve the performance of the semiconductor device.

In an embodiment, the plasma protection layer 16 according to the present embodiment may be undoped polysilicon.

After the plasma protection layer 16 is formed, a plasma treatment may be performed. The plasma treatment may, for example, include a deposition and/or an etch process using plasma. The plasma treatment may be focused on the plasma protection layer 16, and the plasma protection layer 16 may prevent plasma induced damage (PID) of the capacitor, particularly, the top electrode 13 and the dielectric layer 12, during the plasma treatment. The plasma protection layer 16 may also be referred to as a capping layer, a plasma induced damage barrier layer or a plasma induced damage protection layer.

The plasma protection layer 16 may fully cover the top electrode 13. In some embodiments, the plasma protection layer 16 may partially cover the top electrode 13.

The plasma protection layer 16 may have an ultra thin thickness. The plasma protection layer 16 may have a thin thickness so as to serve as an etch stop layer during a subsequent plasma etch process.

Figure 2B:
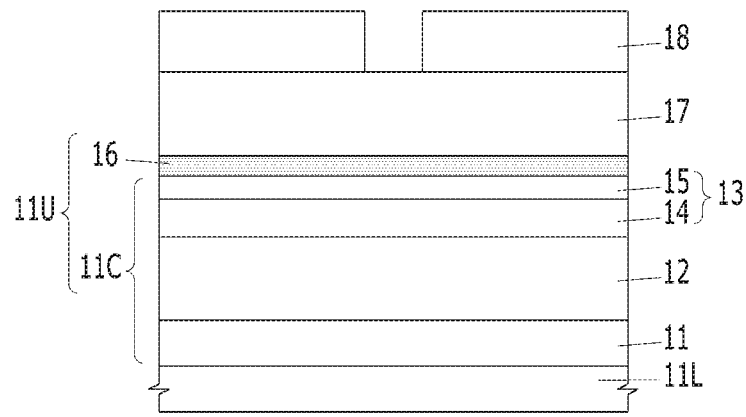

Referring to FIG. 2B, an interlayer dielectric layer 17 may be formed on the upper structure 11U. The interlayer dielectric layer 17 may include silicon oxide.

A contact mask layer 18 may be formed on the interlayer dielectric layer 17.

Figure 2C:
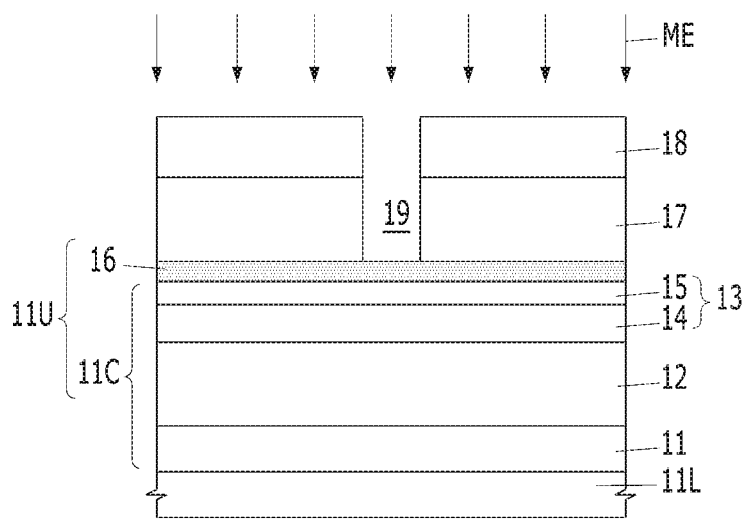
Figure 2D:
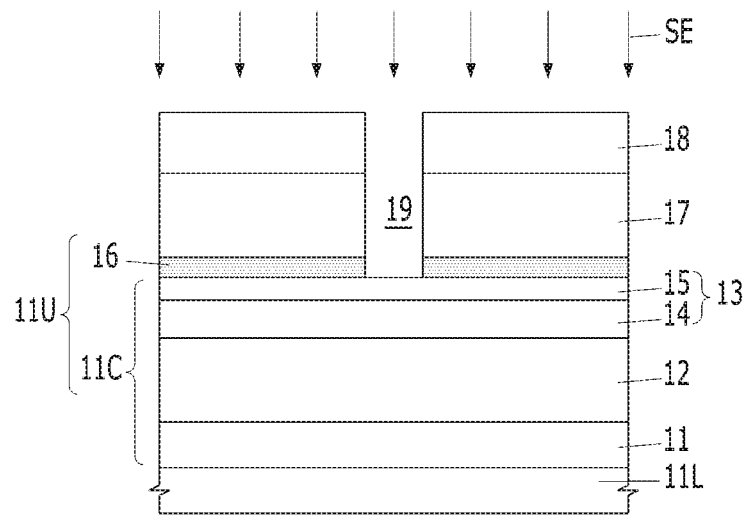

Referring to FIGS. 2C and 2D, the interlayer dielectric layer 17 may be etched using the contact mask layer 18 as an etch barrier. A contact hole 19 may be formed by the etching of the interlayer dielectric layer 17 to expose the plasma protection layer 16. The etch process for forming the contact hole 19 may be stopped at the plasma protection layer 16.

A dry etch process may be performed to form the contact hole 19. The dry etch process may include a plasma etch process. The plasma etch process may include a main etch process ME (refer to FIG. 2C) for etching the interlayer dielectric layer 17 and a sub-etch process SE (refer to FIG. 2D) for etching the plasma protection layer 16.

When the interlayer dielectric layer 17 is etched by the main etch process ME, the top electrode 13 may not be exposed but the plasma protection layer 16 may be exposed.

Since the plasma protection layer 16 has the etch selectivity with respect to the main etch process ME, the main etch process ME may be stopped at the surface of the plasma protection layer 16.

When the interlayer dielectric layer 17 includes silicon oxide, the main etch process ME may be performed using a silicon oxide etch gas. For example, the main etch process ME may be performed using a mixture of a carbon-containing gas, a fluorine-containing gas, an oxygen gas and an argon gas. The main etch process ME may use a carbon-containing gas to maintain a vertical etch profile. A large amount of polymers may be formed by the carbon-containing gas during the main etch process ME. A post-etch process may be performed to remove the polymers. The post-etch process may be performed using a mixture of an oxygen gas and an argon gas.

Referring back to FIG. 2D, a portion of the plasma protection layer 16 may be etched by the sub-etch process SE, and the top surface of the top electrode 13 may be exposed. The sub-etch process SE for etching the plasma protection layer 16 is performed for a short time so that the top electrode 13 may not be attacked by the plasma induced damage (PID).

As the main etch process ME and the sub-etch process SE are sequentially performed, the contact hole 19 may be formed to expose the surface of the top electrode 13 without exposing the top electrode to PID. This is because, during the main etch process ME, the plasma protection layer 16 may serve as an etch stop layer and the sub etch process SE is only performed for a short time.

Figure 2E:
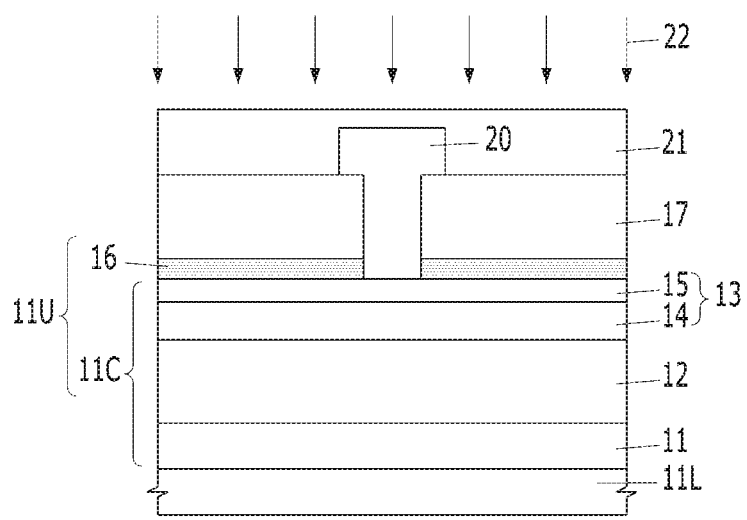

Referring to FIG. 2E, a metal wiring 20 may be formed in the contact hole 19, and coupled to the top electrode 13.

Subsequently, a hydrogen passivation process 22 may be performed. In some embodiments, the hydrogen passivation process 22 may be performed after a metal interlayer dielectric layer 21 is formed on the metal wiring 20.

The lower structure 11L may be passivated with hydrogen by the hydrogen passivation process 22. A dangling bond formed in the lower structure 11L may be removed by the hydrogen passivation process 22. For example, when the lower structure 11L includes a transistor having a gate dielectric layer formed on a semiconductor substrate, the dangling bond may be present at an interface between the gate dielectric layer and the semiconductor substrate. The dangling bond may be removed by the hydrogen passivation process 22. Accordingly, the reliability of the semiconductor device may be improved.

In accordance with the present embodiment, the top electrode 13 and the dielectric layer 12 may be protected from the plasma induced damage by the plasma protection layer 16 during the plasma treatment after the forming of the top electrode 13, for example, the plasma etch process.

In addition, since the plasma etch process can be stopped at the plasma protection layer 16, physical damage to the top electrode 13 may be prevented.

Furthermore, since the plasma protection layer 16 does not block the hydrogen diffusion, the efficiency of the hydrogen passivation process 22 may be improved.

Figure 3:
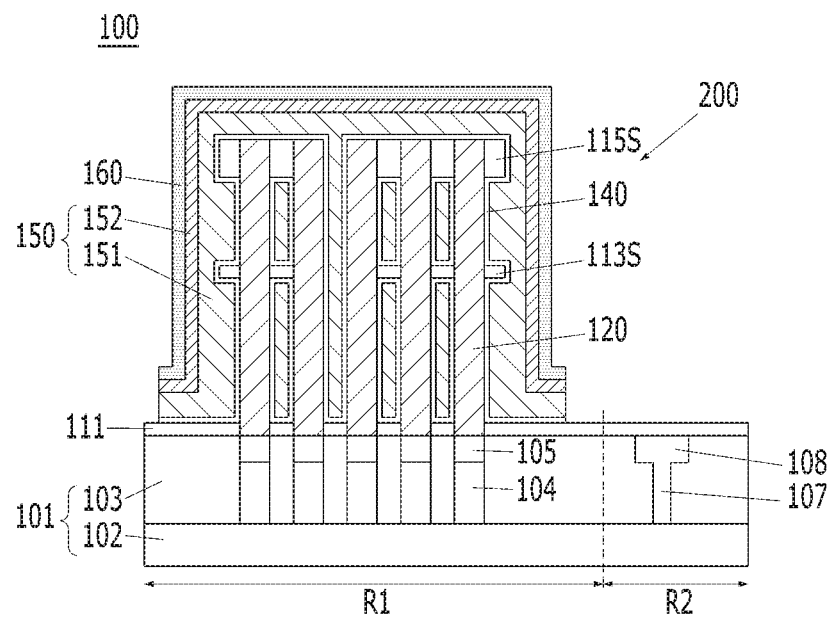
FIG. 3 is a cross-sectional view of a semiconductor device in accordance with an embodiment of the present invention disclosure.

FIG. 3 is a cross-sectional view of a semiconductor device 100 in accordance with an embodiment of the present invention disclosure.

Referring to FIG. 3, the semiconductor device 100 may include a first region R1 and a second region R2. The first region R1 may be a memory cell region, and the second region R2 may be a peripheral circuit region.

The semiconductor device 100 may include a lower structure 101. The lower structure 101 may be a stack structure including a substrate 102 and a dielectric layer 103 on the substrate 102. The lower structure 101 may include a plurality of storage node contact structures formed in the first region R1. Each of the storage node contact structures may be coupled to the substrate 102 through the dielectric layer 103. The storage node contact structure may be a stack of a lower plug 104 and an upper plug 105. For example, the lower plug 104 may include a silicon plug, and the upper plug 105 may include a metal plug. Although not illustrated, buried word lines and bit lines may be further formed in the first region R1. The buried word lines may be formed in the substrate 102, and the bit lines may be formed between the storage node contact structures. The lower structure 101 may further include a lower metal wiring 108 formed in the second region R2. The lower metal wiring 108 may be coupled to the substrate 102 through a contact plug 107. Although not illustrated, transistors including respective source/drain regions and gate electrodes may be formed in the second region R2. The source/drain regions of the transistors may be coupled to the lower metal wiring 108. The lower metal wiring 108 may be formed by the same process as the upper plug 105 of the storage node contact structure.

The semiconductor device 100 may further include a capacitor structure 200. The capacitor structure 200 may be referred to as an upper structure. The capacitor structure 200 may be formed over the first region R1. The capacitor structure 200 may be formed on the lower structure 101. The capacitor structure 200 may include an etch stop layer 111, a bottom electrode 120, a dielectric layer 140 and a top electrode 150. The capacitor structure 200 may further include a plasma protection layer 160. The plasma protection layer 160 may be formed on the top electrode 150. The plasma protection layer 160 may cover the entire structure of the top electrode 150. The plasma protection layer 160 may include a non-conductive material. The plasma protection layer 160 may include a material having an etch selectivity to the top electrode 150. The plasma protection layer 160 may serve as an etch stop layer. The bottom electrode 120 may have a pillar shape. The outer walls of the bottom electrode 120 may be supported by a first supporter 113S and a second supporter 115S. The first and second supporters 113S and 115S may be referred to as multi-level supporters. In some embodiments, each of the multi-level supporters may have two or more layers. Each of the first and second supporters 113S and 115S may include silicon nitride.

The top electrode 150 may be single-layered or multi-layered. The top electrode 150 may include a gap-fill layer 151 and a low resistance layer 152. The gap-fill layer 151 may include silicon germanium. The low resistance layer 152 may include tungsten nitride. The gap-fill layer 151 may fill the narrow gaps between neighboring the bottom electrode 120 without a void. The low resistance layer 152 may lower the resistance of the top electrode 150. In some embodiments, the top electrode 150 may further include a liner layer (not illustrated) which is formed before the gap-fill layer 151 is formed. The liner layer, as a conductive material, may include metal nitride such as tungsten nitride and titanium nitride.

The plasma protection layer 160 may include a non-conductive material. The plasma protection layer 160 may be a material having a high etch selectivity to the top electrode 150. The plasma protection layer 160 may include a material having high hydrogen passivation efficiency. The plasma protection layer 160 may include an engineered stress material.

As described above, the plasma protection layer 160 may include a material having non-conductivity, high hydrogen passivation efficiency, a high etch selectivity and engineered stress. The plasma protection layer 160 may be a material capable of preventing a loss of the top electrode 150 during a subsequent contact-etch process. The plasma protection layer 160 may be a material that facilitates hydrogen diffusion during a subsequent hydrogen passivation process. The plasma protection layer 160 may be a material capable of preventing the first and second supporters 113S and 115S from cracking.

In some embodiments, the plasma protection layer 160 may include a polysilicon-based material or a silicon nitride-based material. The plasma protection layer 160 may include updoped polysilicon (Poly Si), silicon nitride (Sin), silicon oxynitride (SiON), silicon carbon nitride (SiCN), silicon boron nitride (SiBN) or combinations thereof. The updoped polysilicon is a dielectric material since it does not include a dopant. The updoped polysilicon may have a high etch selectivity when silicon oxide is etched. The updoped polysilicon may not block hydrogen diffusion. The updoped polysilicon may have engineered stress.

As a comparative example, the plasma protection layer 160 may include silicon oxide, doped silicon, titanium nitride, tungsten, aluminum or copper.

Since silicon oxide has a low etch selectivity, it is difficult for silicon oxide to prevent damage to the top electrode 13. Since doped silicon, titanium nitride, tungsten, aluminum and copper are conductive materials, the dielectric layer 140 may be damaged by a strong electric field attributable to the concentration of plasma charges. Doped silicon, titanium nitride, tungsten, aluminum and copper are materials that block hydrogen diffusion, which may reduce hydrogen passivation efficiency.

Silicon nitride (SiN), silicon oxynitride (SiON), silicon carbon nitride (SiCN) and silicon boron nitride (SiBN) may have engineered stress. A silicon nitride-based material having the engineered stress may prevent the first and second supporters 113S and 115S from cracking.

The non-conductivity of the plasma protection layer 160 according to the present embodiment may suppress the concentration of the plasma charges, and the high etch selectivity of the plasma protection layer 160 may prevent the etch damage of the top electrode 150. The engineered stress of the plasma protection layer 160 may prevent the first and second supporters 113S and 115S from cracking. The high hydrogen passivation efficiency of the plasma protection layer 160 may improve the performance of the semiconductor device 100.

The plasma protection layer 160 in accordance with the present embodiments may be undoped polysilicon.

Figure 4A:
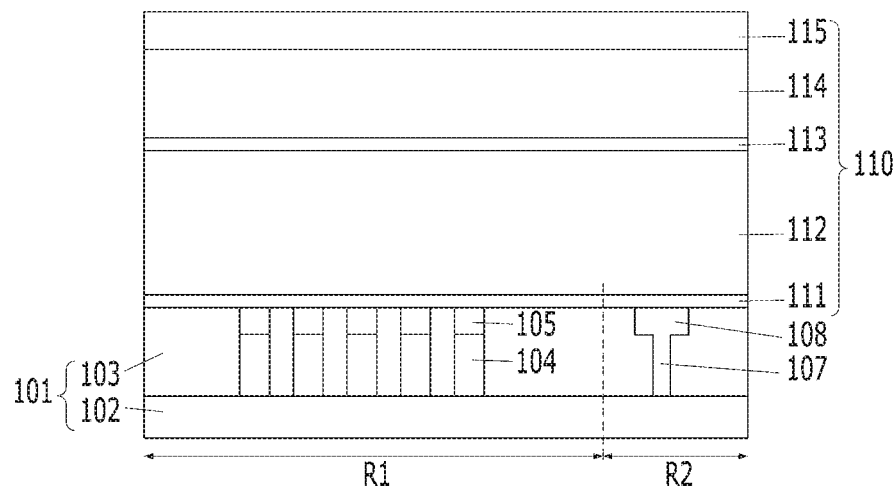
FIGS. 4A to 4N are cross-sectional views illustrating a method for fabricating a semiconductor device in accordance with an embodiment of the present invention disclosure.
Figure 4B:
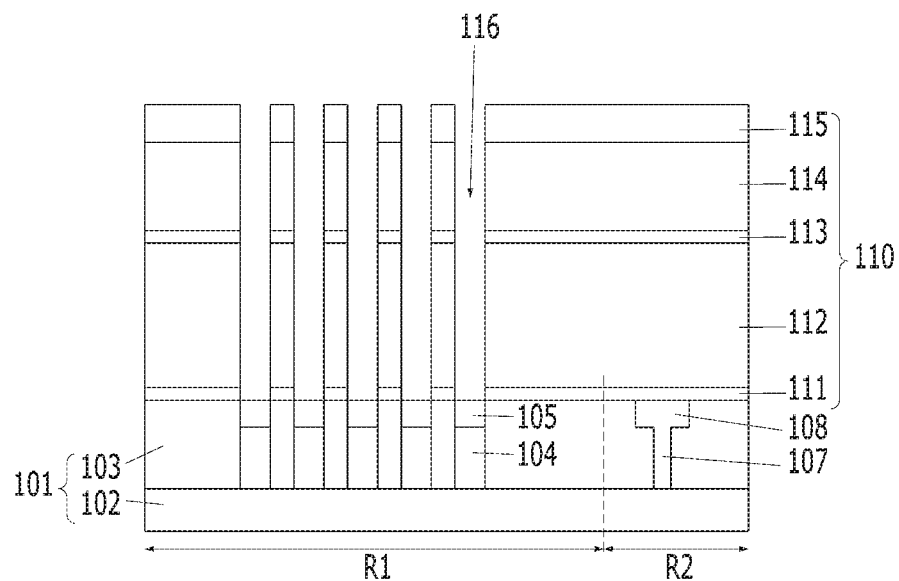
Figure 4C:
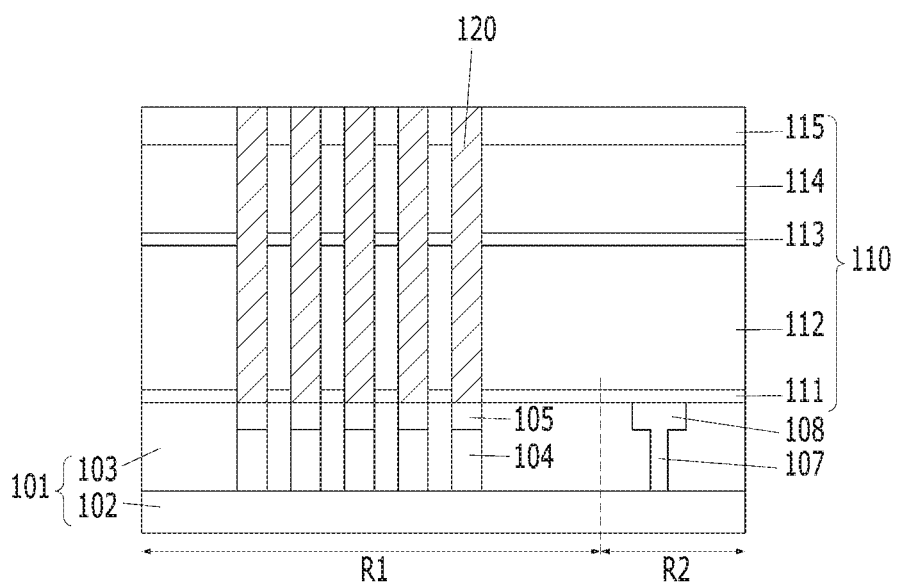
Figure 4D:
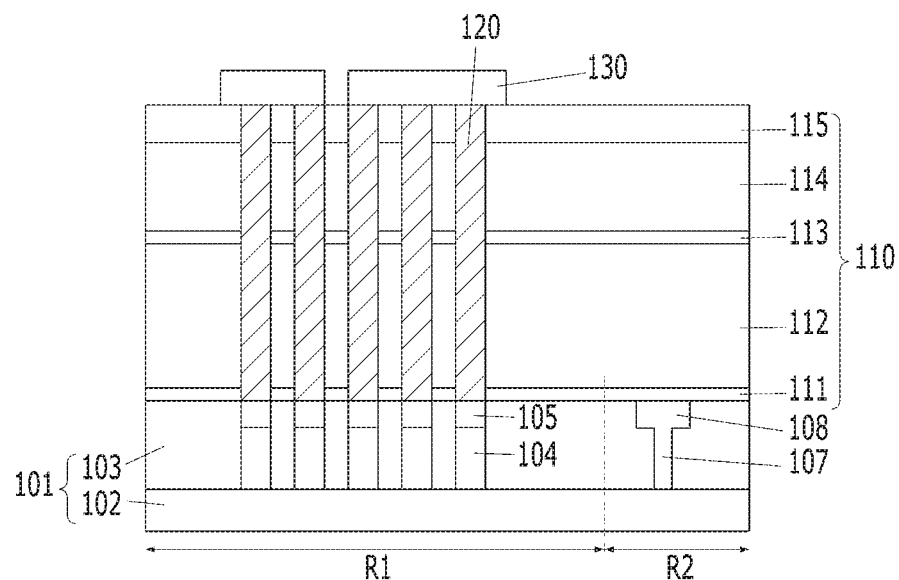
Figure 4E:
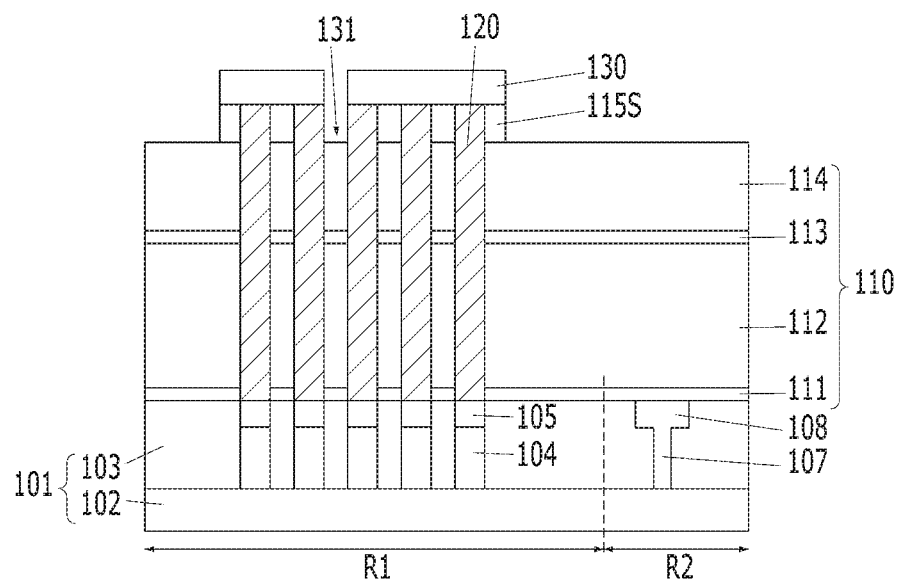
Figure 4F:
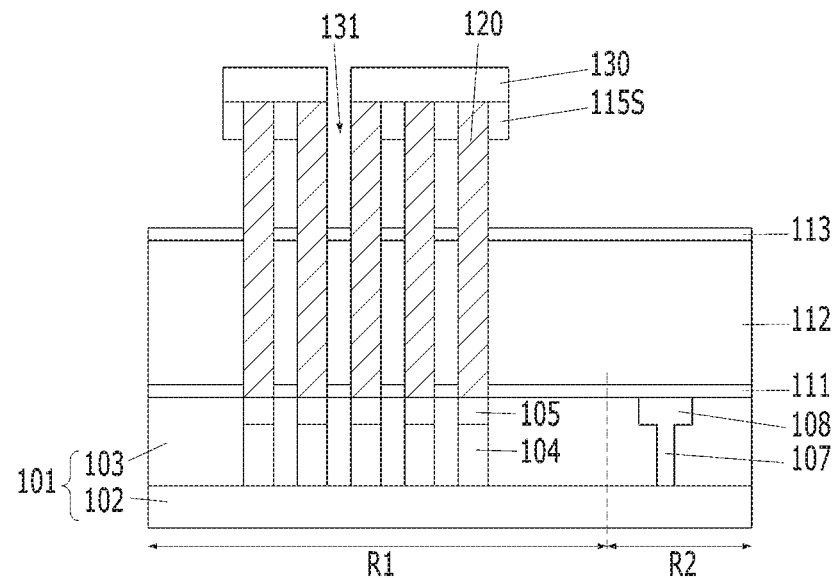
Figure 4G:
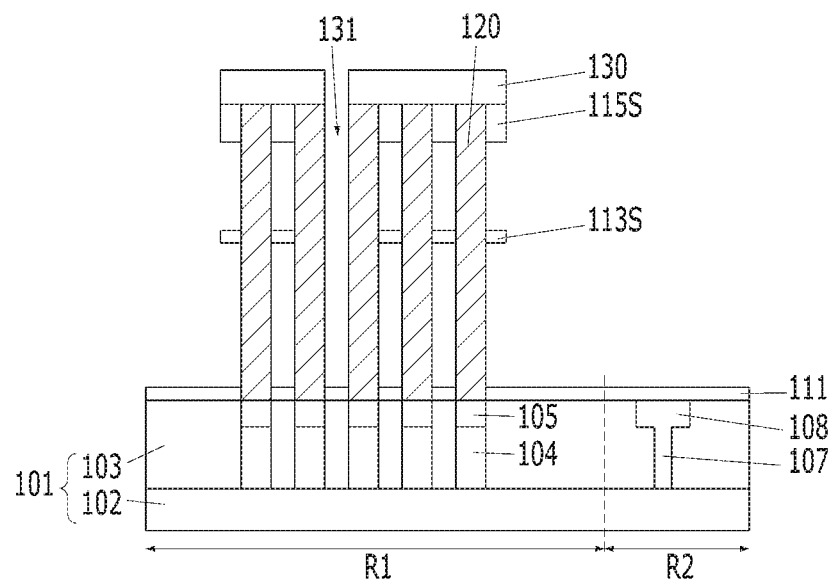
Figure 4H:
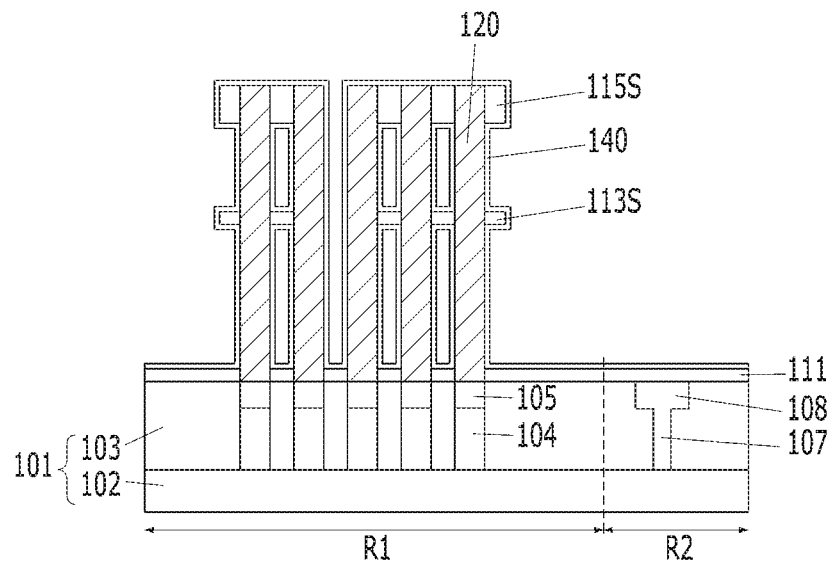
Figure 4I:
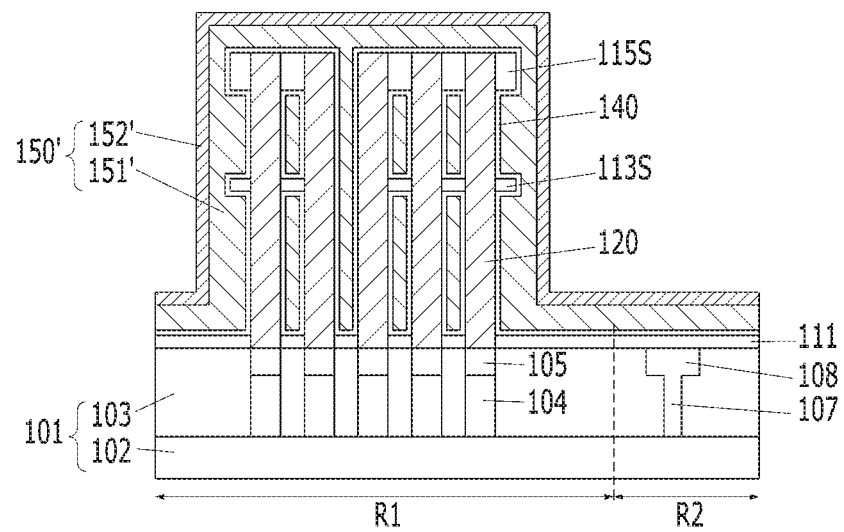
Figure 4J:
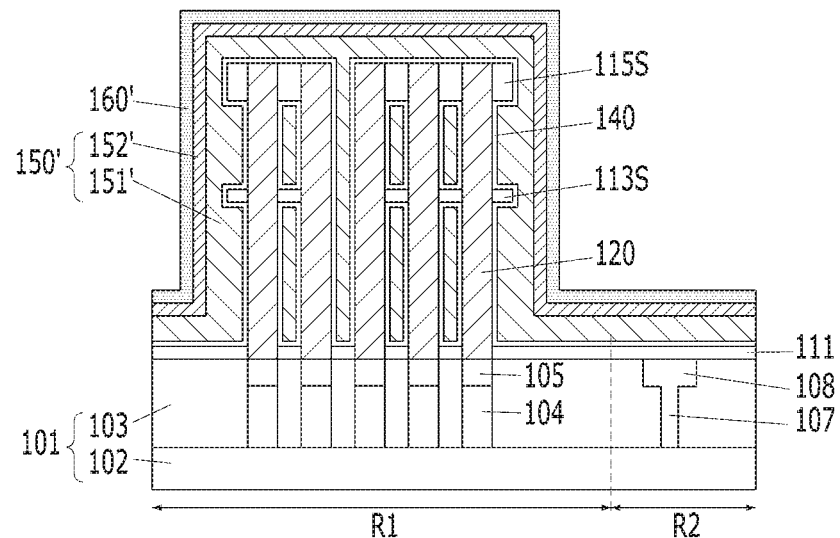
Figure 4K:
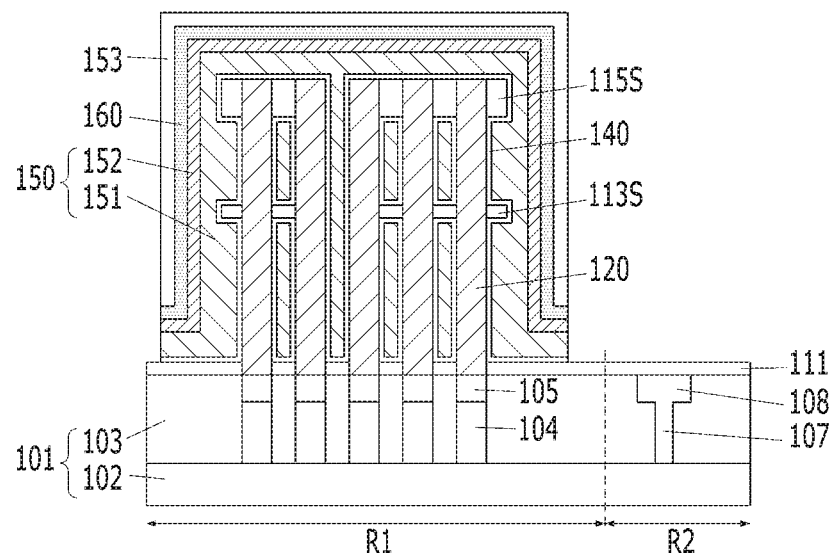
Figure 4L:
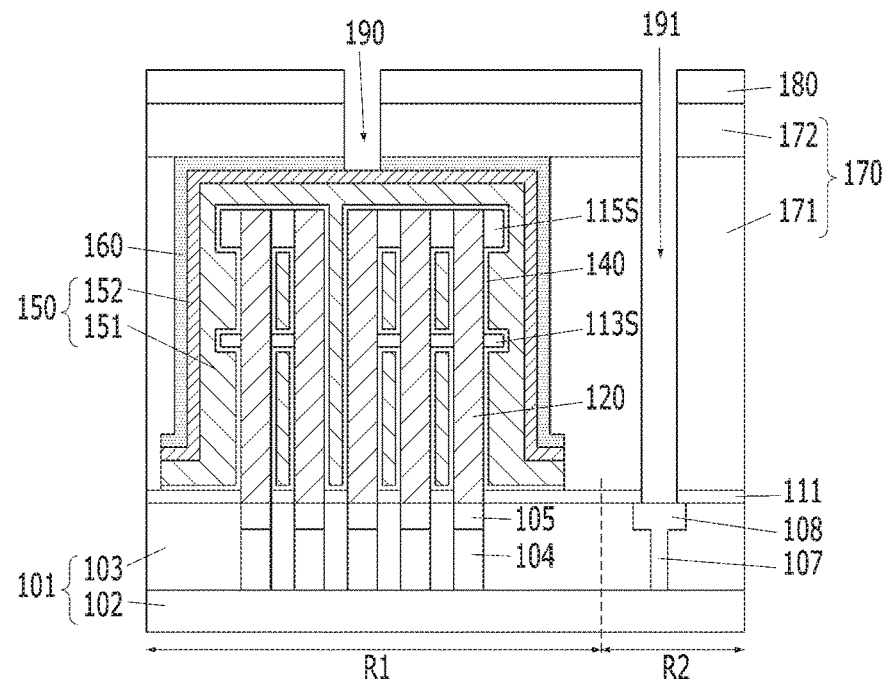
Figure 4M:
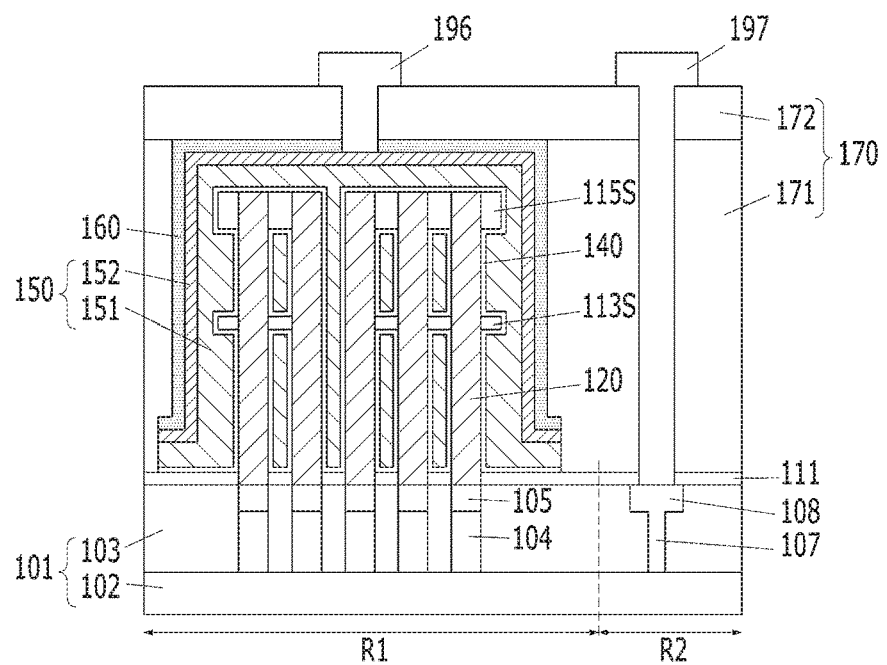
Figure 4N:
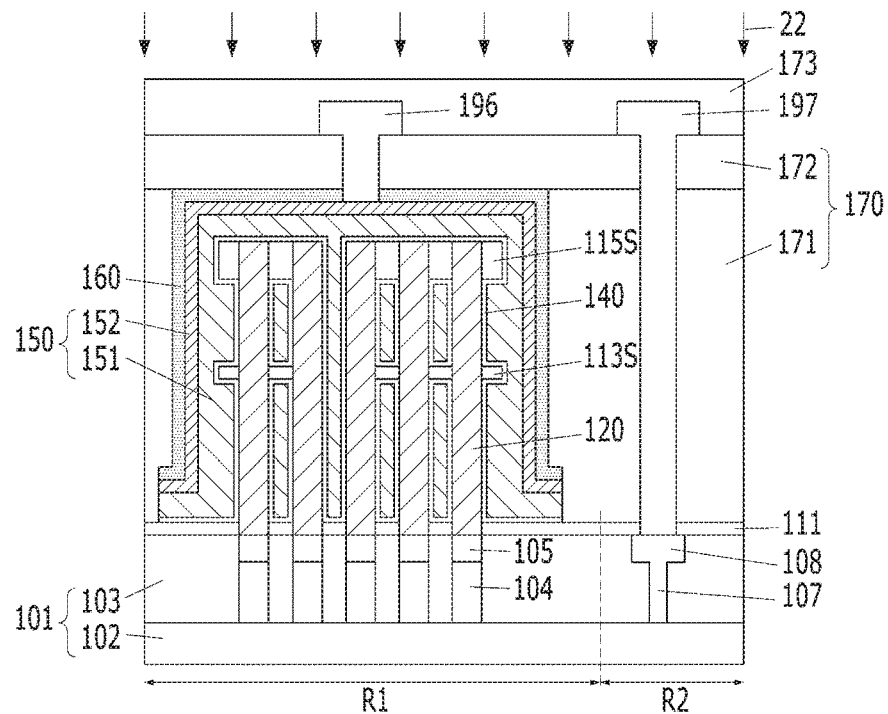

FIGS. 4A to 4N are cross-sectional views illustrating a method for fabricating a semiconductor device in accordance with an embodiment of the present invention disclosure.

Referring to FIG. 4A, a lower structure 101 may be formed. The lower structure 101 may include a semiconductor substrate, semiconductor elements and interlayer dielectric layers. The lower structure 101 may include a first region R1 in which memory cells are disposed, and a second region R2 in which peripheral circuits for controlling the memory cells are disposed. The lower structure 101 may be a stack structure including a substrate 102 and a dielectric layer 103 on the substrate 102. The lower structure 101 may include a plurality of storage node contact structures formed in the first region R1. Each of the storage node contact structures may be coupled to the substrate 102 through the dielectric layer 103. The storage node contact structure may be a stack of a lower plug 104 and an upper plug 105. The lower plug 104 may include a silicon plug, and the upper plug 105 may include a metal plug. Although not illustrated, buried word lines and bit lines may be further formed in the first region R1. The buried word lines may be formed in the substrate 102, and the bit lines may be formed between the storage node contact structures. The lower structure 101 may further include a lower metal wiring 108 formed in the second region R2. The lower metal wiring 108 may be coupled to the substrate 102 through a contact plug 107. Although not illustrated, transistors including respective source/drain regions and gate electrodes may be formed in the second region R2. The source/drain regions of the transistors may be coupled to the lower metal wiring 108. The lower metal wiring 108 may be formed by the same process as the upper plug 105 of the storage node contact structure.

The uppermost layer of the lower structure 101 may be the planarized dielectric layer 103. The dielectric layer 103 may be formed of any suitable dielectric material including, but not limited to, high-density plasma oxide (HDP oxide), TetraEthylOrthoSilicate (TEOS), Plasma Enhanced Tetra-EthylOrthoSilicate (PE-TEOS), O3-Tetra Ethyl Ortho Silicate ($O_3$-TEOS), an undoped Silicate Glass (USG), a PhosphoSilicate Glass (PSG), a BoroSilicate Glass (BSG), a BoroPhosphoSilicate Glass (BPSG), a Fluoride Silicate Glass (FSG), a Spin on Glass (SOG), Tonen SilaZene (TOSZ) or combinations thereof. In addition, the dielectric layer 103 may be formed of silicon nitride, silicon oxynitride or a low-k material having a low dielectric constant.

A mold structure 110 may be formed on the lower structure 101. The mold structure 110 may include an etch stop layer 111, a first mold layer 112, a first supporter layer 113, a second mold layer 114 and a second supporter layer 115 that are sequentially stacked on the lower structure 101. The first and second mold layers 112 and 114 may be, for example, silicon oxide ($SiO_2$) or germanium (Ge) containing oxide. The first mold layer 112 may be formed to have a larger thickness than the second mold layer 114. The first and second mold layers 112 and 114 may be formed using a deposition process such as chemical vapor deposition (CVD) or physical vapor deposition (PVD).

The etch stop layer 111 may be formed of a material having an etch selectivity to the lower structure 101 and the first mold layer 112. The etch stop layer 111 may include silicon nitride or silicon oxynitride.

The first and second supporter layers 113 and 115 may be formed of a material having an etch selectivity to the first and second mold layers 112 and 114. The first and second supporter layers 113 and 115 may include silicon nitride or silicon carbon nitride (SiCN). The second supporter layer 115 may be formed to have a larger thickness than the first supporter layer 113.

Referring to FIG. 4B, a plurality of openings 116 may be formed. The openings 116 may be formed by etching the mold structure 110 using a mask layer (not illustrated). The second supporter layer 115, the second mold layer 114, the first supporter layer 113 and the first mold layer 112 may be sequentially etched using a mask layer as an etch barrier, in order to form the openings 116. The etch process for forming the openings 116 may be stopped at the etch stop layer 111. A dry etch process, a wet etch process or a combination thereof may be used to form the openings 16. Each of the openings 16 may be referred to as a hole in which a bottom electrode or a storage node is to be formed. The opening 116 may have a high aspect ratio. Here, the aspect ratio may refer to the ratio of height (H) to width (W). The opening 116 may have an aspect ratio of at least 1:1. For example, the opening 116 may have a high aspect ratio of at least 5:1 or greater. As another example, the opening 116 may have a high aspect ratio of 10:1 or greater.

Subsequently, the etch stop layer 111 may be etched to expose the top surface of the lower structure 101 below the openings 116.

The mold structure 110 including the plurality of openings 116 may be formed by the above-described series of etch processes. The mold structure 110 may be a stacked layer of the etch stop layer 111, the first mold layer 112, the first supporter layer 113, the second mold layer 114 and the second supporter layer 115.

Referring to FIG. 4C, a bottom electrode 120 may be formed in each of the openings 116. The bottom electrode 120 may fill the inside of each of the openings 116. The bottom electrode 120 may have a pillar shape. In order to form the bottom electrode 120 having the pillar shape, a conductive material is deposited to gap-fill the opening 116 and then planarized. The bottom electrode 120 may include polysilicon, a metal, metal nitride, conductive metal oxide, metal silicidea noble metal or combinations thereof. The bottom electrode 120 may include one or more of titanium (Ti), titanium nitride (TiN), tantalum (Ta), tantalum nitride (TaN), titanium aluminum nitride (TiAlN), tungsten (W) or tungsten nitride (WN), ruthenium (Ru), ruthenium oxide ($RuO_2$), iridium (Ir), iridium oxide ($IrO_2$), platinum (Pt) and combinations thereof. In the present embodiment, the bottom electrode 120 may include titanium nitride (TiN). The bottom electrode 120 may include titanium nitride (ALD-TiN) formed by atomic layer deposition (ALD).

In some embodiments, the bottom electrode 120 may include a stack structure of titanium nitride and tungsten (Not shown). In some embodiments, the bottom electrode 120 may include a stack structure of titanium nitride and polysilicon (Not shown).

Referring to FIG. 4D, a supporter mask layer 130 may be formed. The supporter mask layer 130 may include photoresist or amorphous carbon. The supporter mask layer 130 may expose some surfaces of the second supporter layer 115.

Referring to FIG. 4E, a portion of the second supporter layer 115 may be etched using the supporter mask layer 130. A second supporter opening 131 and a second supporter 115S may be formed by the etching of the second supporter layer 115.

The second supporter 115S may contact the upper sidewall of the bottom electrode 120. A portion of the second mold layer 114 may be exposed by the second supporter 115S. The surface of the second mold layer 114 may be over-etched. In other words, the bottom surface of the second supporter opening 131 may extend into the surface of the second mold layer 114. The second supporter 115S may have a shape of surrounding a portion of the outer wall of the bottom electrode 120. The second supporter 115S may prevent the bottom electrode 120 having a high aspect ratio from collapsing in a subsequent process of removing the second mold layer 114.

Referring to FIG. 4F, the second mold layer 114 may be removed. For example, the second mold layer 114 may be removed by a wet dip-out process. Wet chemicals for removing the second mold layer 114 may be supplied through the second supporter opening 131. One or more of suitable wet chemicals may be employed, such as HF, $NH_4F/NH_4OH$, $H_2O_2$, HCl, $HNO_3$ and $H_2SO_4$.

For example, when the second mold layer 114 is formed of silicon oxide, the second mold layer 114 may be removed by the wet dip-out process using chemicals containing hydrofluoric acid. When the second mold layer 114 is removed, the second supporter 115S having an etch selectivity to the second mold layer 114 is not removed but remains. Accordingly, since the adjacent bottom electrode 120 is supported by the second supporter 115S, the bottom electrode 120 may be prevented from collapsing.

Referring to FIG. 4G, a first supporter 113S may be formed. A portion of the first supporter layer 113 may be etched using the supporter mask layer 130. The first supporter 113S may be formed by the etching of the first supporter layer 113.

After the first supporter 113S is formed, the first mold layer 112 may be removed. For example, the first mold layer 112 may be removed by the wet dip-out process. Wet chemicals for removing the first mold layer 112 may be supplied through the second supporter opening 131. One or more of chemicals such as HF, $NH_4F/NH_4OH$, $H_2O_2$, HCl, $HNO_3$ and $H_2SO_4$ may be used as the wet chemicals.

For example, when the first mold layer 112 is formed of silicon oxide, the first mold layer 112 may be removed by the wet dip-out process using chemicals containing hydrofluoric acid. When the first mold layer 112 is removed, the second and first supporters 115S and 113S having an etch selectivity to the first mold layer 112 may not be removed but remain. Accordingly, since the adjacent bottom electrode 120 is supported by the second and first supporters 115S and 113S, the bottom electrode 120 may be prevented from collapsing.

When the first mold layer 112 is removed, the etch stop layer 111 may prevent damage of the lower structure 101.

As the second and first mold layers 114 and 112 are removed, the entire outer all of the bottom electrode 120 may be exposed. The top portion of the bottom electrode 120 may be supported by the second supporter 115S. The middle portion of the bottom electrode 120 may be supported by the first supporter 113S. The bottom portion of the bottom electrode 120 may be supported by the etch stop layer 111.

Referring to FIG. 4H, the supporter mask layer 130 may be removed. Subsequently, a dielectric layer 140 may be formed. The dielectric layer 140 may be formed to conformally cover all the exposed surfaces of the bottom electrode 120 and the first and second supporters 113S and 115S. A portion of the dielectric layer 140 may also cover the etch stop layer 111. The dielectric layer 140 may include a high-k material having a higher dielectric constant than silicon oxide. The high-k material may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$) or strontium titanium oxide $SrTiO_3$. In some embodiments, the dielectric layer 140 may be formed of a composite layer including two or more layers of the high-k material described above.

In the present embodiment, the dielectric layer 140 may be formed of a zirconium oxide-based material having good leakage current characteristics while sufficiently lowering the equivalent oxide layer thickness (EOT). For example, the dielectric layer 140 may include a TZAZ ($ZrO_2/Al_2O_3/ZrO_2$) structure. In some embodiments, the dielectric layer 140 may include an HAH ($HfO_2/Al_2O_3/HfO_2$) structure.

In some embodiments, the dielectric layer 140 may include a TZAZ ($TiO_2/ZrO_2/Al_2O_3/ZrO_2$), TZAZT ($TiO_2/ZrO_2/Al_2O_3/ZrO_2/TiO_2$), ZAZT ($ZrO_2/Al_2O_3/ZrO_2/TiO_2$), TZ ($TiO_2/ZrO_2$) or ZAZAT ($ZrO_2/Al_2O_3/ZrO_2/Al_2O_3/TiO_2$) structure. In dielectric layer stacks such as the TZAZ, TZAZT, ZAZT, TZ and ZAZAT structures, $TiO_2$ may be replaced by $Ta_2O_5$.

The dielectric layer 140 may be formed using chemical vapor deposition (CVD) or atomic layer deposition (ALD) with excellent step coverage.

Referring to FIG. 4I, a top electrode material 150' may be formed on the dielectric layer 140. The top electrode material 150' may fill the gaps between the adjacent bottom electrode 120. The top electrode material 150' may include a metal-based material. For example, the top electrode material 150' may include titanium (Ti), titanium nitride (TiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt) or combinations thereof. The top electrode material 150' may be formed using low pressure chemical vapor deposition (LPCVD), plasma enhanced chemical vapor deposition (PECVD) or atomic layer deposition (ALD). The top electrode material 150' may include titanium nitride (ALD-TiN) formed by the ALD.

In some embodiments, the top electrode material 150' may have a multi-layer structure. The top electrode material 150' may be formed by sequentially stacking a first metal-containing material, silicon germanium and a second metal-containing material. The first and second metal-containing materials may include titanium (Ti), titanium nitride (TiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt) or combinations thereof. For example, the first metal-containing material may be titanium nitride, and the second metal-containing material may be WN/W where tungsten nitride and tungsten are stacked. The silicon germanium may be doped with boron.

In the present embodiment, the top electrode material 150' may include a gap-fill material 151' and a low resistance material 152'. The gap-fill material 151' may include silicon germanium (SiGe), and the low resistance material 152' may include tungsten nitride (WN). The gap-fill material 151' may fill the narrow gaps between the adjacent bottom electrode 120 without a void. The low resistance material 152' may lower the resistance of the top electrode material 150'.

Referring to FIG. 4J, a capping material 160' may be formed conformally to cover the top electrode material 150'. The capping material 160' may include a non-conductive material. The capping material 160' may be a material having a higher etch selectivity to the top electrode material 150'. For example, the capping material 160' may be a material having a sufficiently higher etch selectivity to the top electrode material 150' for preventing a loss of the top electrode material 150' during a subsequent contact-etch process. The capping material 160' may include updoped polysilicon (Poly Si), silicon nitride (Sin), silicon oxynitride (SiON), silicon carbon nitride (SiCN), silicon boron nitride (SiBN) or combinations thereof. For example, the capping material 160' may be formed of undoped polysilicon or engineered stressed silicon nitride for a high etch selectivity, hydrogen passivation efficiency and crack prevention.

Referring to FIG. 4K, a top electrode patterning process may be performed. Accordingly, a plasma protection layer 160 and a top electrode 150 may remain in the first region R1. The capping material 160' may be etched using a top electrode mask layer 153 to form the plasma protection layer 160. The top electrode material 150' may be etched using the top electrode mask layer 153 to form the top electrode 150. In some embodiments, after the top electrode 150 is formed, a portion of the dielectric layer 140 may be etched. The top electrode 150 may include a gap-fill layer 151 and a low resistance layer 152. The gap-fill layer 151 may be formed by etching the gap-fill material 151', and the low resistance layer 152 may be formed by etching the low resistance material 152'.

The plasma protection layer 160 may have a shape of fully covering the top surface of the top electrode 150. The plasma protection layer 160 may directly contact the low resistance layer 152, and may not contact the gap-fill layer 151. The plasma protection layer 160 may cover the capacitor structure, that is, the bottom electrode 120, the dielectric layer 140, the first and second supporters 113S and 115S and the top electrode 150. The plasma protection layer 160 may protect the capacitor structure from a subsequent process.

Referring to FIG. 4L, the top electrode mask layer 153 may be removed. Subsequently, an interlayer dielectric layer 170 may be formed on the resultant structure including the capacitor structure. The interlayer dielectric layer 170 may include silicon oxide. The interlayer dielectric layer 170 may include a first interlayer dielectric layer 171 and a second interlayer dielectric layer 172. First, the first interlayer dielectric layer 171 may be deposited and then planarized until the plasma protection layer 160 is exposed. Subsequently, the second interlayer dielectric layer 172 may be formed on the planarized first interlayer dielectric layer 171. The first interlayer dielectric layer 171 and the second interlayer dielectric layer 172 may include Tetra-Ethyl OrthoSilicate (TEOS).

Contact holes 190 and 191 may be formed in the interlayer dielectric layer 170. The interlayer dielectric layer 170 may be etched using a contact mask layer 180 to form the contact holes 190 and 191. The contact holes 190 and 191 may include the first contact hole 190 and the second contact hole 191. The first contact hole 190 may have a height of landing on the top surface of the top electrode 150 in the first region R1, and the second contact hole 191 may have a height of landing on the lower structure 101 of the second region R2. In this manner, the first and second contact holes 190 and 191 may have different heights. The first contact hole 190 may have a smaller height than the second contact hole 191.

Referring to FIG. 4M, a first metal wiring 196 may be formed in the first contact hole 190, and a second metal wiring 197 may be formed in the second contact hole 191. The first metal wiring 196 may be coupled to the top electrode 150, and the second metal wiring 197 may be coupled to the lower metal wiring 108.

Referring to FIG. 4N, after the first and second metal wiring 196 and 197 are formed, a hydrogen passivation process 22 as described above with reference to FIG. 2E may be performed. For example, the hydrogen passivation process 22 may be performed after a metal interlayer dielectric layer 173 is formed on the metal wirings 196 and 197.

Figure 5A:
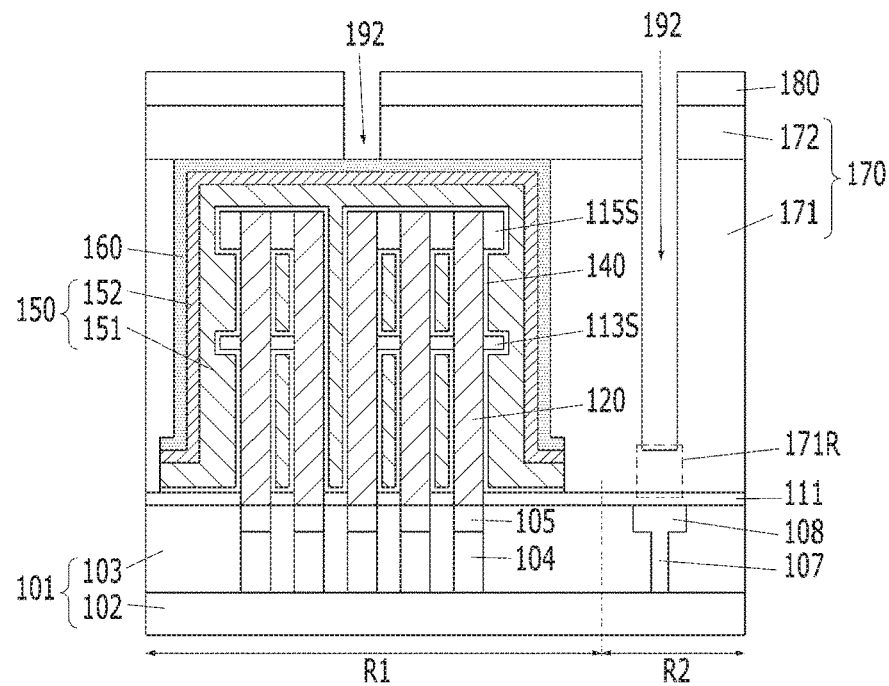
FIGS. 5A to 5C are cross-sectional views illustrating a plasma etch process for forming first and second contact holes shown in FIG. 4L.
Figure 5B:
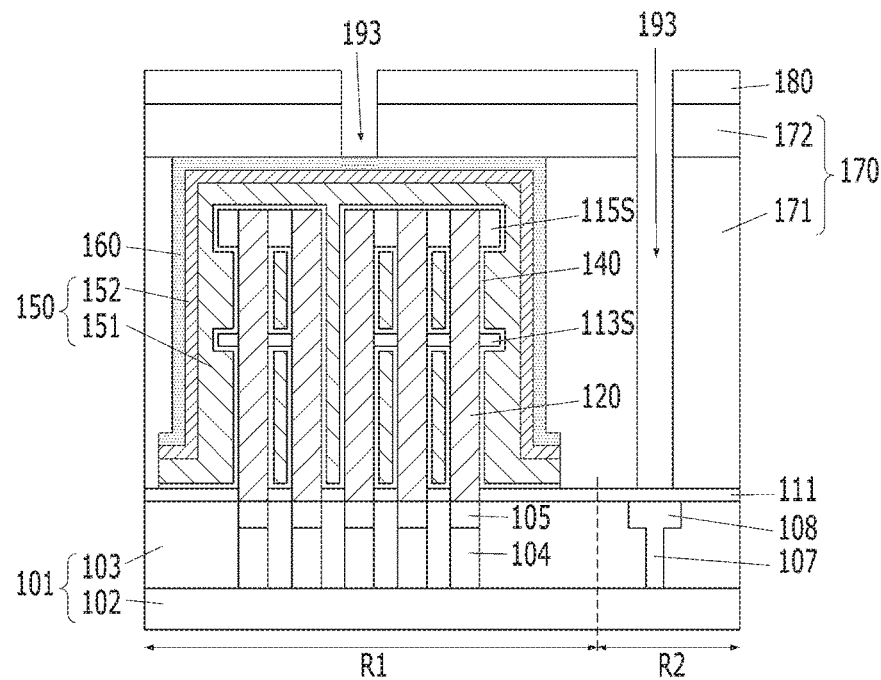
Figure 5C:
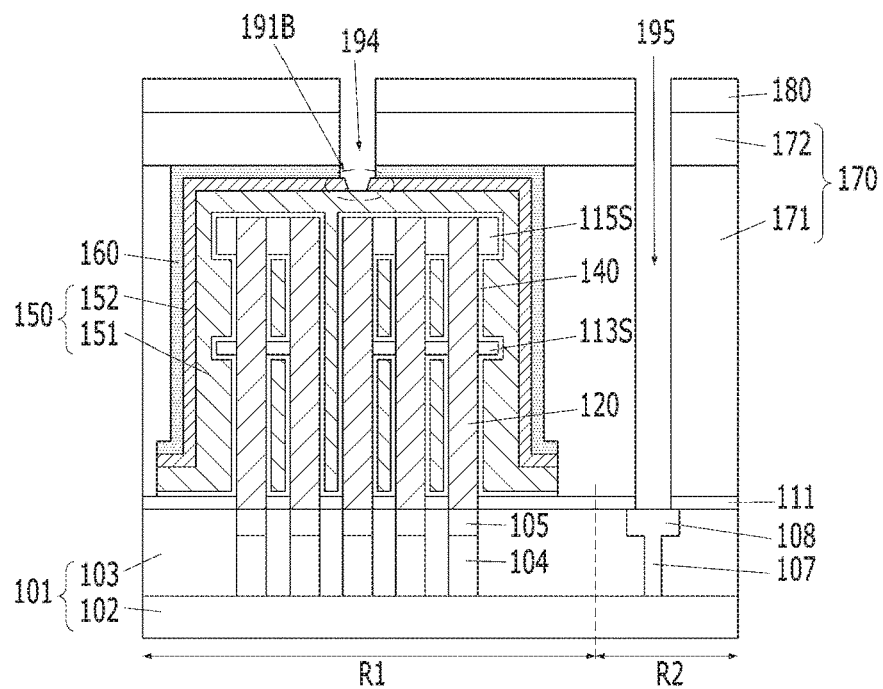

FIGS. 5A to 5C are cross-sectional views illustrating a plasma etch process for forming the first and second contact holes 190 and 191 shown in FIG. 4L.

Referring to FIGS. 5A to 5C, the plasma etch process for forming the first and second contact holes 190 and 191 may include a first etch process 192, a second etch process 193, a third etch process 194 and a fourth etch process 195.

Referring to FIG. 5A, the first etch process 192 may be performed. The first etch process 192 may be performed so that a portion of the first interlayer dielectric layer 171 remains on the etch stop layer 111. When the first etch process 192 is performed, the plasma protection layer 160 may be exposed over the top electrode 150. Since the plasma protection layer 160 has an etch selectivity with respect to the first etch process 192, the first etch process 192 may be stopped.

When the interlayer dielectric layer 170 includes silicon oxide, the first etch process 192 may be performed using a silicon oxide etch gas. For example, the first etch process 192 may be performed using a mixture of a carbon-containing gas, a fluorine-containing gas, an oxygen gas and an argon gas. The first etch process 192 may use a carbon-containing gas to maintain a vertical etch profile.

Referring to FIG. 5B, the second etch process 193 may be performed. The second etch process 193 may etch the remaining first interlayer dielectric layer 171R so that the etch process is stopped at the etch stop layer 111. When the second etch process 193 is performed, the plasma protection layer 160 may stop the etch process over the top electrode 150. Since the plasma protection layer 160 has an etch selectivity with respect to the first etch process 192, the etch process may be stopped.

The second etch process 193 may be performed using a silicon oxide etch gas. For example, the second etch process 193 may be performed using a mixture of a carbon-containing gas, a fluorine-containing gas, an oxygen gas and an argon gas. The second etch process 193 may use a carbon-containing gas to maintain a vertical etch profile.

While the first and second etch processes 192 and 193 are performed, a large amount of polymers may be generated. A post-etch process may be performed to remove the polymers. The post-etch process may be performed using a mixture of an oxygen gas and an argon gas.

Referring to FIG. 5C, third and fourth etch processes 194 and 195 may be performed. The third etch process 194 may be performed first, and then the fourth etch process 195 may be performed. In some embodiments, the fourth etch process 195 may be performed first, and then the third etch process 194 may be performed. In some embodiments, the third and fourth etch processes 194 and 195 may be performed simultaneously.

A portion of the plasma protection layer 160 may be etched by the third etch process 194 so that the top surface of the top electrode 150 may be exposed. A portion of the etch stop layer 111 may be etched by the fourth etch process 195 so that the top surface of the lower structure 101 may be exposed. Since the third etch process 194 for etching the plasma protection layer 160 is performed for a short time, the top electrode 150 may not be attacked by the plasma induced damage.

The first and second contact holes 190 and 191 of FIG. 4L may be formed by sequentially performing the first to fourth etch processes 192 to 195 as described above. The plasma protection layer 160 may serve as an etch stop layer during the first and second etch processes 192 and 193.

During the third etch process 194, a bottom critical dimension of the first contact hole 190 may be reduced (refer to reference numeral "191B"). Thus, the concentration of the plasma charges may be reduced.

A dry etch process, for example, the plasma etch process, may be performed to form the first and second contact holes 190 and 191. The top electrode 150 may be damaged by the plasma etch process. However, in the present embodiment, the plasma etch process may be stopped at the plasma protection layer 160. Accordingly, the top electrode 150 and the dielectric layer 140 may be protected from plasma induced damage.

During the etch process for forming the second contact hole 191, the etch process for forming the first contact hole 190 may be completed at the plasma protection layer 160.

The plasma protection layer 160 may have a high etch selectivity to etch gases for forming the first and second contact holes 190 and 191. Accordingly, the first contact hole 190 may not land on the top electrode 150 because the plasma protection layer 160 caps the top electrode 150. In other words, since the etch process is stopped at the plasma protection layer 160, plasma inducement to the top electrode 150, the dielectric layer 140 and the bottom electrode 120 may be blocked.

As the bottom critical dimension of the first contact hole 190 decreases, contact resistance may increase. Accordingly, a plurality of first contact holes 190 may be formed to prevent reduction of the contact resistance, in accordance with the present embodiments. Further, the bottom of the first contact hole 190 is formed of a material having a high etch selectivity to the interlayer dielectric layer 170 so as to have a vertical etch profile.

Figure 5D:
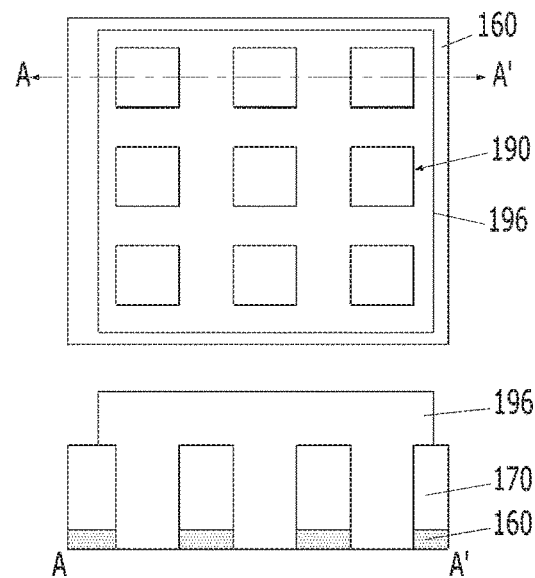
FIG. 5D is a diagram illustrating a first contact hole array in accordance with an embodiment of the present invention disclosure.

FIG. 5D is a diagram illustrating a first contact hole array in accordance with an embodiment of the present invention disclosure. A plurality of first contact holes 190 arranged in a matrix of rows and columns may be formed on the plasma protection layer 160. The number of first contact holes 190 per row and per column may vary by design. The common first metal wiring 196 may be formed in the plurality of first contact holes 190. The contact holes may have a rectangular cross section when viewed from the top, however, the invention is not limited in this way.

Figure 6:
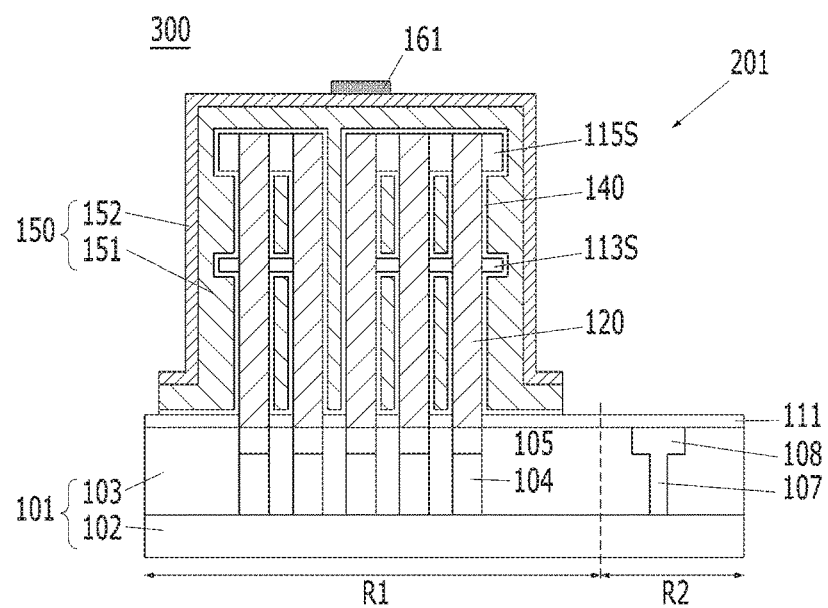
FIG. 6 is a cross-sectional view of a semiconductor device in accordance with an embodiment of the present invention disclosure.

FIG. 6 is a cross-sectional view of a semiconductor device 300 in accordance with an embodiment of the present invention disclosure.

Referring to FIG. 6, the semiconductor device 300 may include a first region R1 and a second region R2. The first region R1 may be a memory cell region, and the second region R2 may be peripheral circuit region. The semiconductor device 300 may further include a capacitor structure 201. The capacitor structure 201 may be formed in the first region R1. The capacitor structure 201 may be formed on a lower structure 101. The capacitor structure 201 may include an etch stop layer 111, a bottom electrode 120, a dielectric layer 140 and a top electrode 150.

The semiconductor device 300 may further include a plasma protection layer 161 that partially covers the capacitor structure 201. The plasma protection layer 161 may be formed on the top electrode 150. The plasma protection layer 161 may not cover the entire structure of the top electrode 150 but partially cover the top electrode 150. The plasma protection layer 161 may include a non-conductive material. The plasma protection layer 161 may include a material having an etch selectivity to the top electrode 150. The plasma protection layer 161 may serve as an etch stop layer. The bottom electrode 120 may have a pillar shape as described above. The outer walls of the plurality of bottom electrode 120 may be supported by a first supporter 113S and a second supporter 115S. The first and second supporters 113S and 115S may be referred to as multi-level supporters. In some embodiments, each of the multi-level supporters may have two or more layers. Each of the first and second supporters 113S and 115S may include silicon nitride.

The top electrode 150 may include a gap-fill layer 151 and a low resistivity layer 152. The gap-fill layer 151 may include silicon germanium. The low resistivity layer 152 may include tungsten nitride. The gap-fill layer 151 may fill a narrow gap between the bottom electrodes 120 without a void. The low resistivity layer 152 may decrease the resistivity of the top electrode 150.

The plasma protection layer 161 may include a non-conductive material. The plasma protection layer 161 may be a material having an etch selectivity to the top electrode 150. The plasma protection layer 161 may be a material capable of preventing a loss of the top electrode 150 during a subsequent contact-etch process. The plasma protection layer 161 may include updoped polysilicon (Poly Si), silicon nitride (Sin), silicon oxynitride (SiON), silicon carbon nitride (SiCN), silicon boron nitride (SiBN) or combinations thereof.

FIGS. 7A to 7F are cross-sectional views illustrating a method for fabricating a semiconductor device in accordance with an embodiment of the present invention disclosure.

Figure 7A:
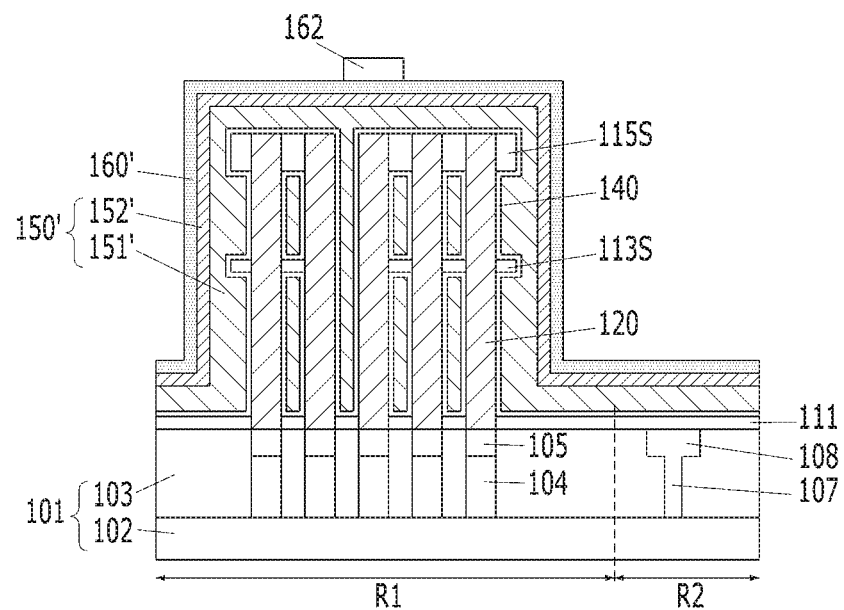
FIGS. 7A to 7F are cross-sectional views illustrating a method for fabricating a semiconductor device in accordance with an embodiment of the present invention disclosure.

Referring to FIG. 7A, a capping material 160' may be formed. A process of forming the capping material 160' may be performed in the same manner as described with reference to FIGS. 4A to 4J.

After the capping material 160' is formed on a top electrode material 150', a capping mask layer 162 may be formed on the capping material 160'. The capping mask layer 162 may include a photoresist pattern.

Figure 7B:
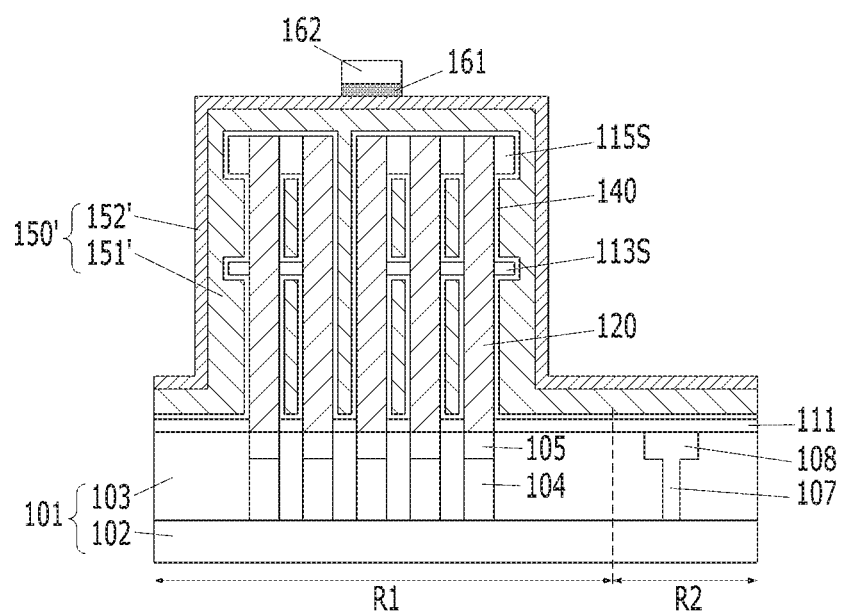

Referring to FIG. 7B, a plasma protection layer 161 may be formed. The capping material 160' may be etched using the capping mask layer 162 to form the plasma protection layer 161. The plasma protection layer 161 may partially expose the top surface of the top electrode material 150'. For example, most of the top surface of the top electrode material 150' may be exposed by the plasma protection layer 161.

Figure 7C:
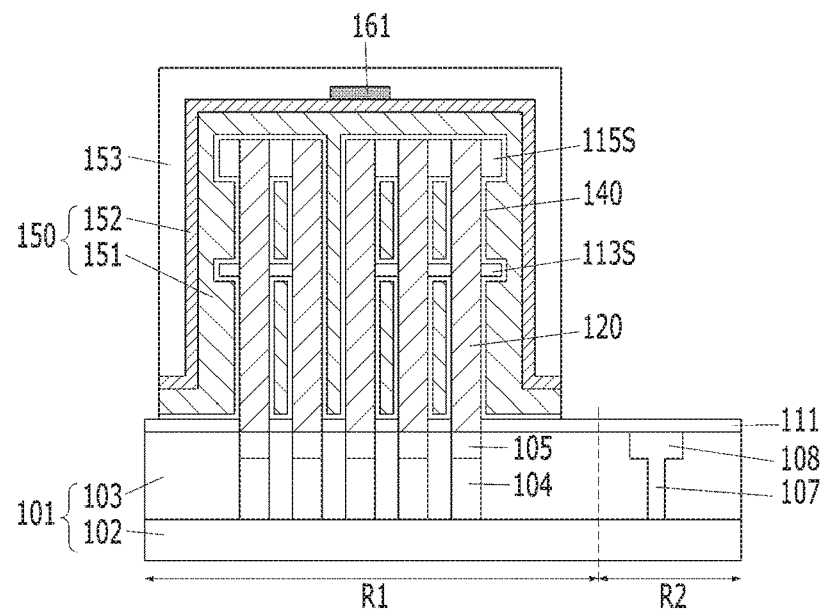

Referring to FIG. 7C, the capping mask layer 162 may be removed. Subsequently, a top electrode patterning process may be performed. The top electrode patterning process may include forming a top electrode mask layer 153 and etching the top electrode material 150' to form a top electrode 150.

The top electrode mask layer 153 may be formed on the top electrode material 150' including the plasma protection layer 161.

The top electrode material 150' may be etched using the top electrode mask layer 153. Accordingly, a top electrode 150 may be formed in a first region R1. In some embodiments, after the top electrode 150 is formed, a portion of a dielectric layer 140 may be etched. The top electrode 150 may include a gap-fill layer 151 and a low resistance layer 152. The gap-fill layer 151 may be formed by etching a gap-fill material 151', and the low resistance layer 152 may be formed by etching a low resistance material 152'.

Figure 7D:
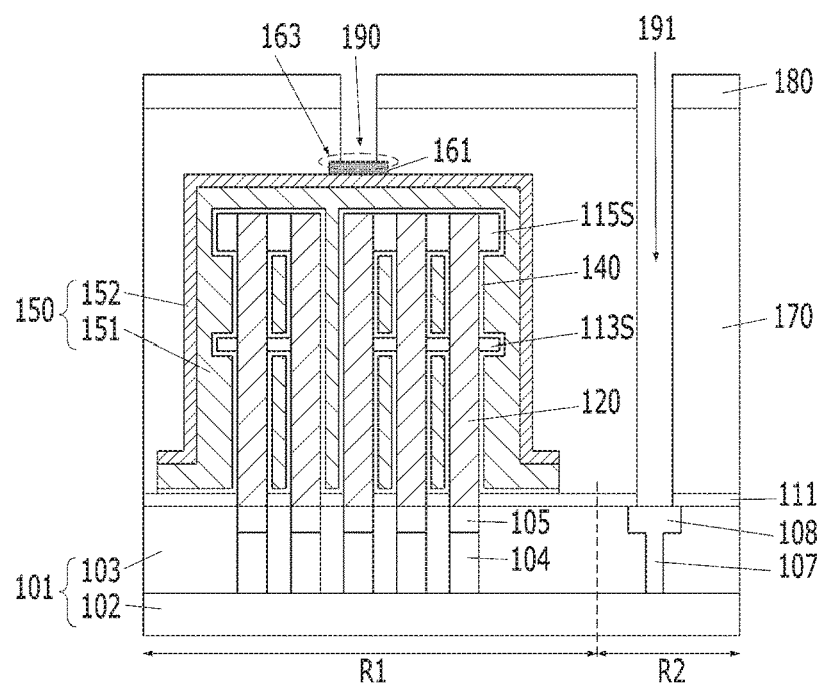

Referring to FIG. 7D, the top electrode mask layer 153 may be removed. Subsequently, an interlayer dielectric layer 170 may be formed on the resultant structure including a capacitor structure and the plasma protection layer 161. The interlayer dielectric layer 170 may include silicon oxide.

Contact holes 190 and 191 may be formed in the interlayer dielectric layer 170. The interlayer dielectric layer 170 may be etched using a contact mask layer 180 to form the contact holes 190 and 191. The contact holes 190 and 191 may include the first contact hole 190 and the second contact hole 191. The first contact hole 190 may have a height of landing on the top surface of the plasma protection layer 161, and the second contact hole 191 may have a height of landing on a lower metal wiring 108. In this manner, the first and second contact holes 190 and 191 may have different heights. The first contact hole 190 may have a smaller height than the second contact hole 191.

A dry etch process, for example, a plasma etch process, may be performed to form the first and second contact holes 190 and 191. The top electrode 150 may be damaged by the plasma etch process. However, in the present embodiment, the plasma etch process may be stopped at the plasma protection layer 161. Accordingly, the top electrode 150 and the dielectric layer 140 may be protected from plasma induced damage.

During the etch process for forming the second contact hole 191, the etch process for forming the first contact hole 190 may be completed at the plasma protection layer 161 (refer to reference numeral "163"). The plasma protection layer 161 may have a high etch selectivity to etch gases for forming the first and second contact holes 190 and 191. Accordingly, the first contact hole 190 may not land on the top electrode 150 by the plasma protection layer 161. In other words, since the etch process is stopped at the plasma protection layer 161, plasma inducement to the top electrode 150, the dielectric layer 140 and a bottom electrode 120 may be blocked.

The etch processes for forming the first and second contact holes 190 and 191 may be performed in substantially the same manner as those described with reference to FIGS. 5A to 5C.

Figure 7E:
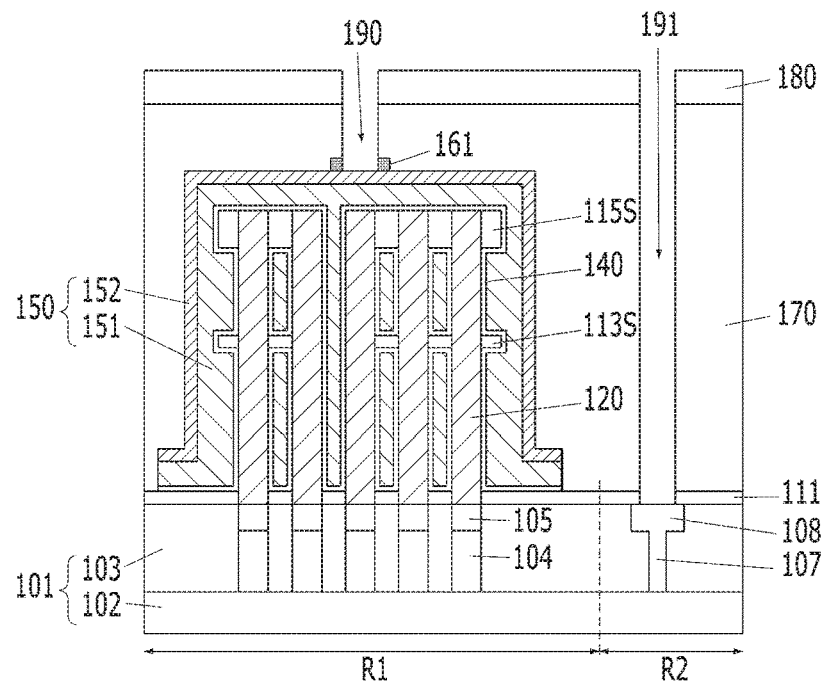

Referring to FIG. 7E, the plasma protection layer 161 may be etched to expose the surface of the top electrode 150. Since the etch process for etching the plasma protection layer 161 is performed for a short time, the top electrode 150 and the dielectric layer 140 may not be attacked by the plasma induced damage.

Figure 7F:
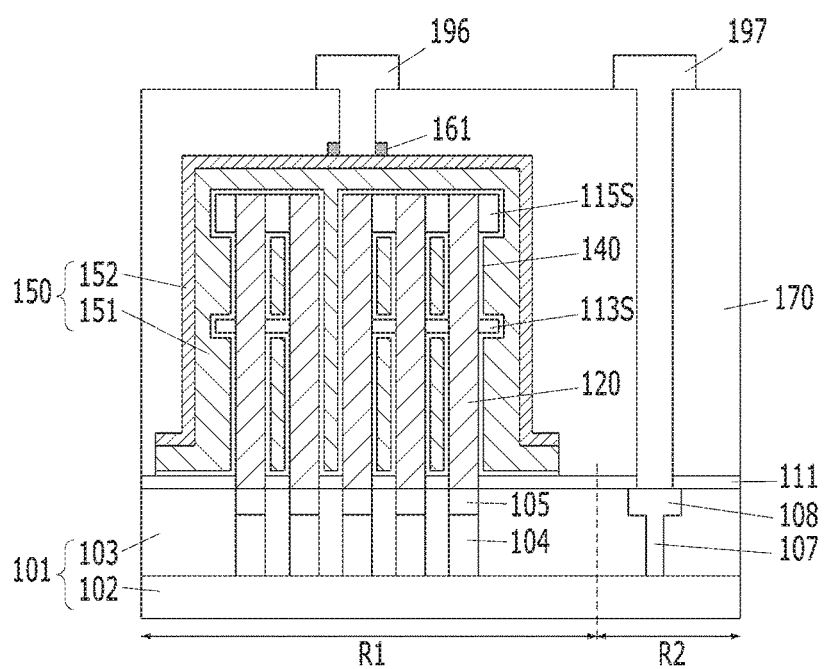

Referring to FIG. 7F, a first metal wiring 196 may be formed in the first contact hole 190, and a second metal wiring 197 may be formed in the second contact hole 191. The first metal wiring 196 may be coupled to the top electrode 150, and the second metal wiring 197 may be coupled to the lower metal wiring 108.

Figure 7G:
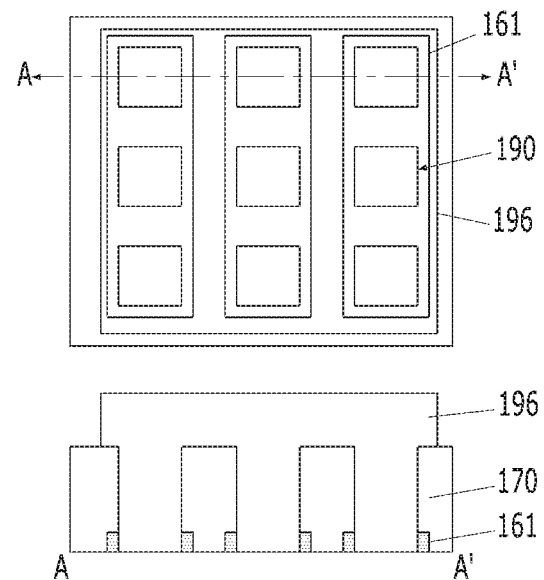
FIG. 7G is a diagram illustrating a first contact hole array in accordance with an embodiment of the present invention disclosure.

FIG. 7G is a diagram illustrating a first contact hole array in accordance with an embodiment of the present invention disclosure. A plurality of first contact holes 190 may be formed in a plurality of plasma protection layers 161. The plurality of first contact holes 190 may be formed in each of the plasma protection layers 161. The common first metal wiring 196 may be formed in the plurality of first contact holes 190.

Although not illustrated, a hydrogen passivation process 22 as described above with reference to FIG. 2E may be performed, after the first metal wiring 196 and a second metal wiring 197 are formed.

FIGS. 8 to 12 are cross-sectional views of semiconductor devices in accordance with various embodiments of the present invention disclosure.

Figure 8:
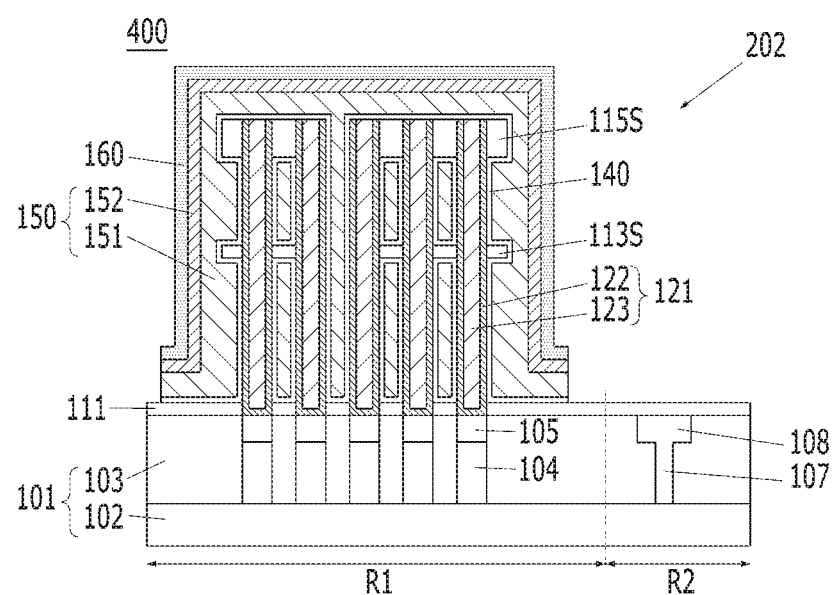
FIGS. 8 to 12 are cross-sectional views of semiconductor devices in accordance with embodiments.

Referring to FIG. 8, a semiconductor device 400 may be similar to the semiconductor device 100 shown in FIG. 3. The semiconductor device 400 may include a capacitor structure 202. The capacitor structure 202 may include an etch stop layer 111, a bottom electrode 121, a dielectric layer 140 and a top electrode 150. The capacitor structure 202 may further include a plasma protection layer 160. The plasma protection layer 160 may be formed on the top electrode 150. The plasma protection layer 160 may cover the entire structure of the top electrode 150. The plasma protection layer 160 may include a non-conductive material. The plasma protection layer 160 may include a material having an etch selectivity to the top electrode 150. The plasma protection layer 160 may serve as an etch stop layer. The bottom electrode 121 may have a pillar shape. The outer walls of bottom electrodes 121 may be supported by a first supporter 113S and a second supporter 115S. The first and second supporters 113S and 115S may be referred to as multi-level supporters. In some embodiments, each of the multi-level supporters may have two or more layers. Each of the first and second supporters 113S and 115S may include silicon nitride.

Differently from the bottom electrode 120 of the semiconductor device 100 shown in FIG. 3, the bottom electrode 121 may include a cylindrical electrode 122 and a pillar-shaped electrode 123. The pillar-shaped electrode 123 may fill the inside of the cylindrical electrode 122. The top surfaces of the pillar-shaped electrode 123 and the cylindrical electrode 122 may be at the same level. The cylindrical electrode 122 may include metal nitride, and the pillar-shaped electrode 123 may include polysilicon.

Figure 9:
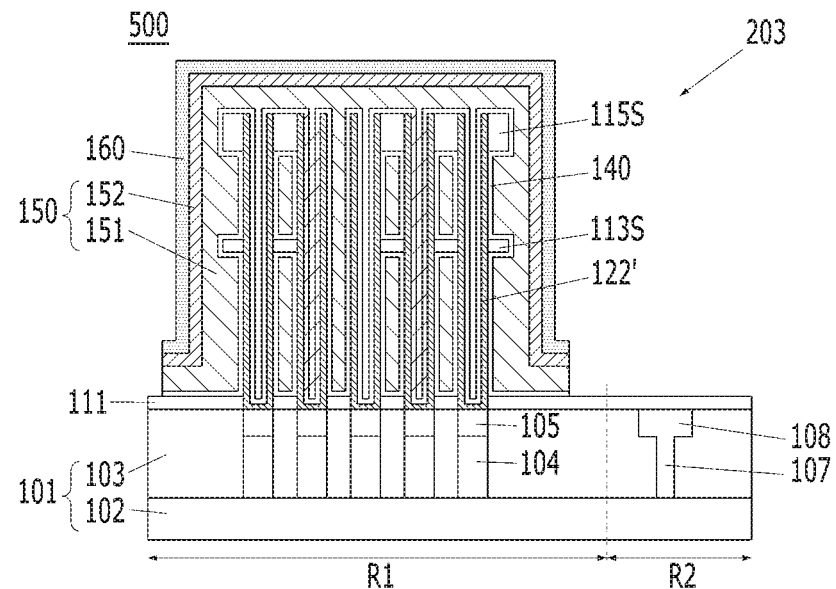

Referring to FIG. 9, a semiconductor device 500 may be similar to the semiconductor device 100 shown in FIG. 3. The semiconductor device 500 may include a capacitor structure 203. The capacitor structure 203 may include an etch stop layer 111, a cylindrical bottom electrode 122', a dielectric layer 140 and a top electrode 150. The dielectric layer 140 may be conformally formed on the inner wall of the cylindrical bottom electrode 122'. A portion of the top electrode 150, that is, a gap-fill layer 151, may be formed in the cylindrical bottom electrode 122'.

Figure 10:
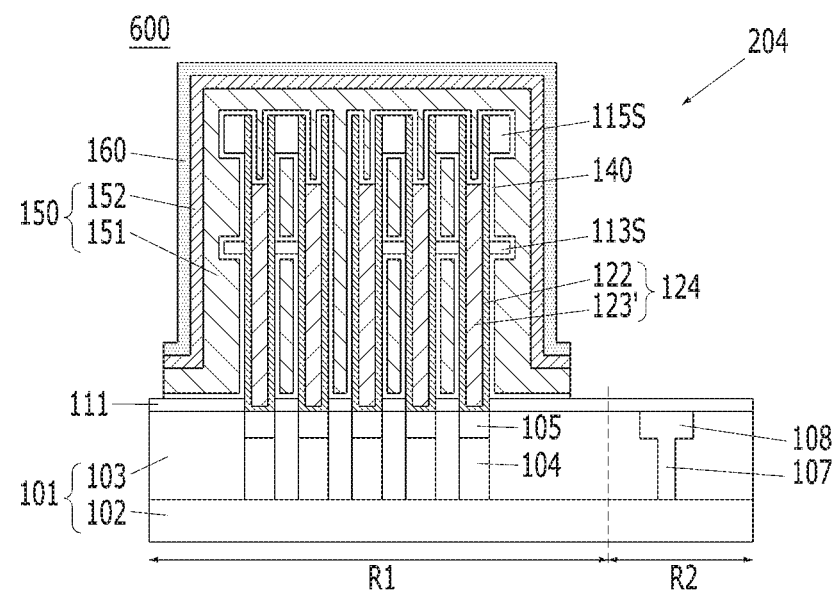

Referring to FIG. 10, a semiconductor device 600 may be similar to the semiconductor device 100 shown in FIG. 3. The semiconductor device 600 may include a capacitor structure 204. The capacitor structure 204 may include an etch stop layer 111, a bottom electrode 124, a dielectric layer 140 and a top electrode 150. The bottom electrode 124 may include a cylindrical bottom electrode 122 and a pillar-shaped bottom electrode 123'. The top surface of the pillar-shaped bottom electrode 123' may be at a lower level than the top surface of the cylindrical bottom electrode 122. The bottom electrode 124 may be referred to as a pylinder-shaped (combination of pillar and cylinder) structure.

Figure 11:
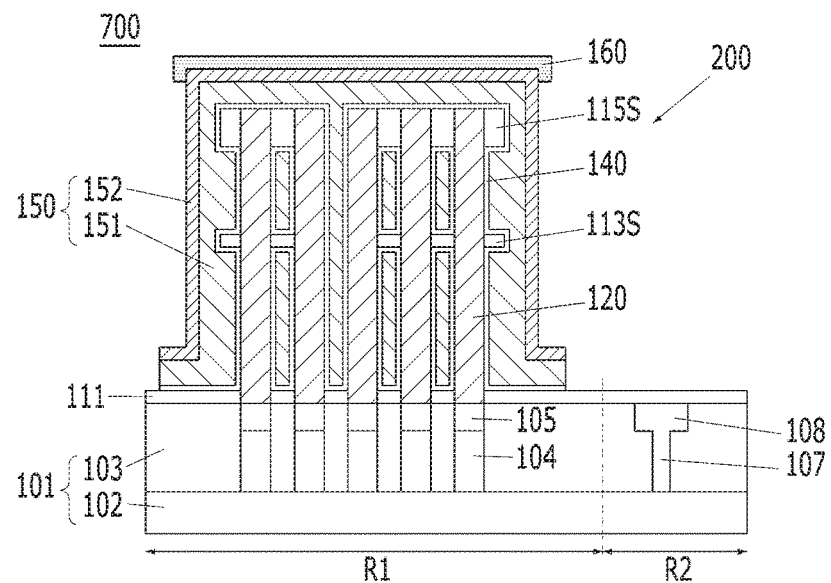

Referring to FIG. 11, a semiconductor device 700 may be similar to the semiconductor device 100 shown in FIG. 3. The semiconductor device 700 may include a plasma protection layer 160. The plasma protection layer 160 may selectively cover an upper region of a top electrode 150.

Figure 12:
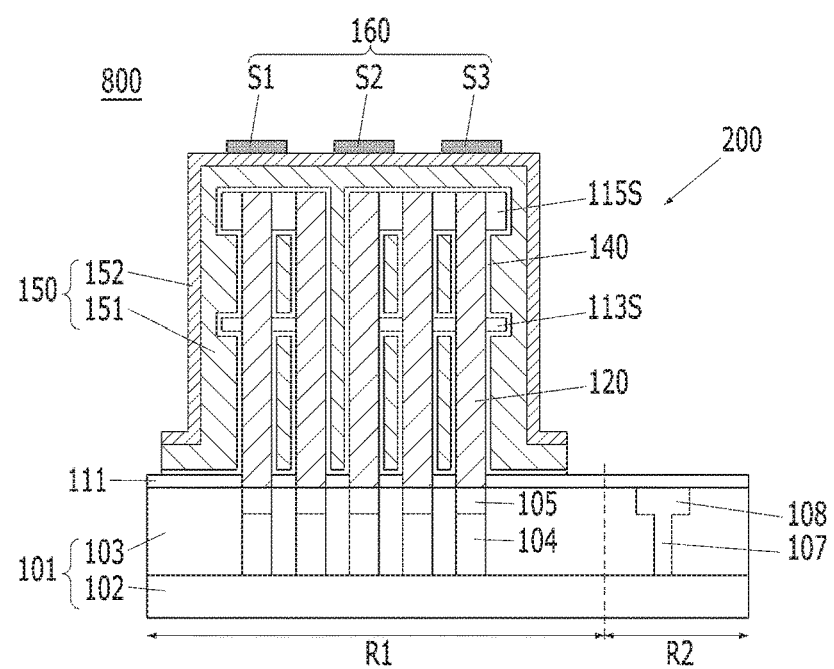

Referring to FIG. 12, a semiconductor device 800 may be similar to the semiconductor device 100 shown in FIG. 3. The semiconductor device 800 may include a plasma protection layer 160 formed of a plurality of non-conductive segments S1, S2 and S3.

The plasma protection layer 160 included in each of the semiconductor devices 400, 500, 600, 700 and 800 described above may be substantially the same as the plasma protection layer 16 and 160 described with reference to FIGS. 1A to 5D.

The plasma protection layer 160 included in each of the semiconductor devices 400, 500, 600, 700 and 800 described above may be replaced by the plasma protection layer 161 described with reference to FIGS. 6 to 7G.

Although not illustrated, a contact hole and a metal wiring may be formed on the plasma protection layer 160 included in each of the semiconductor devices 400, 500, 600, 700 and 800 described above. The contact hole and the metal wiring may be formed by the methods described with reference to FIGS. 2A to 7G. Further, although not illustrated, the hydrogen passivation process 22 described with reference to FIG. 2E may be performed, after the metal wiring is formed.

According to the embodiments, a plasma protection layer that can prevent plasma induced damage is formed on a capacitor, thereby improving the electrical characteristics and reliability of the capacitor.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A method for fabricating a semiconductor device, the method comprising:
    forming an upper structure in which a bottom electrode, a dielectric layer, a top electrode and a plasma protection layer are sequentially stacked on a lower structure;
    exposing the upper structure to a plasma treatment; and
    exposing the plasma-treated upper structure and the lower structure to a hydrogen passivation process,
    wherein the plasma protection layer includes a non-conductive segment that partially covers the top electrode, and the plasma treatment is focused on the segment.

2. The method of claim 1, wherein the plasma protection layer is formed of a material having a high etch selectivity with respect to the plasma treatment.

3. The method of claim 1, wherein the plasma protection layer is formed of a material having a high hydrogen diffusivity with respect to the hydrogen passivation process.

4. The method of claim 1, wherein the plasma treatment is focused on the plasma protection layer.

5. The method of claim 1, wherein the plasma treatment includes an etch process using plasma.

6. The method of claim 1, wherein the exposing of the upper structure to the plasma treatment includes:
    forming an interlayer dielectric layer on the upper structure;
    forming one or more contact holes by performing a plasma etch process on the interlayer dielectric layer so that the etch process is stopped at the plasma protection layer; and
    etching the plasma protection layer exposed by the contact holes so as to expose the top electrode.

7. The method of claim 6, wherein the forming of the contact holes by performing the plasma etch process on the interlayer dielectric layer includes:
    performing a main etch process to vertically etch the interlayer dielectric layer; and
    performing a post-etch process to remove polymers formed during the main etch process.

8. The method of claim 1, wherein the plasma protection layer includes undoped polysilicon.

9. The method of claim 1, wherein the upper structure further comprising a supporter that supports the bottom electrode.

10. The method of claim 9, wherein the plasma protection layer includes a material having engineered stress.

11. The method of claim 1, wherein the plasma protection layer includes engineered stressed silicon nitride.

12. A method for fabricating a semiconductor device, comprising:
    forming a capacitor in which a bottom electrode, a dielectric layer and a top electrode are sequentially stacked on a lower structure;
    forming a plasma protection layer including a plurality of non-conductive segments on the top electrode;
    forming an interlayer dielectric layer on the plasma protection layer;
    forming a contact hole landing on each of the segments by performing a plasma etch process on the interlayer dielectric layer;
    partially etching the segments to expose the top electrode below the contact hole;
    forming a metal wiring connected to the top electrode through the contact hole; and
    exposing the capacitor, the metal wiring and the lower structure to a hydrogen passivation process.

13. The method of claim 12, wherein the plasma protection layer is formed of a material having a high etch selectivity with respect to the plasma etch process.

14. The method of claim 12, wherein the plasma protection layer is formed of a material having a high hydrogen diffusivity with respect to the hydrogen passivation process.

15. The method of claim 12, wherein the plasma etch process is focused on the non-conductive segments.

16. The method of claim 12, wherein the plasma protection layer includes undoped polysilicon.

17. The method of claim 12, wherein the plasma protection layer includes engineered stressed silicon nitride.

18. The method of claim 12, wherein the forming of the capacitor further includes forming a supporter that supports the bottom electrode.

19. The method of claim 12, wherein the forming of the contact hole includes:
    performing a main etch process to vertically etch the interlayer dielectric layer; and
    performing a post-etch process to remove polymers formed during the main etch process.

* * * * *